United States Patent
Snider et al.

(10) Patent No.: US 7,652,911 B2
(45) Date of Patent: Jan. 26, 2010

(54) NANOSCALE SHIFT REGISTER AND SIGNAL DEMULTIPLEXING USING MICROSCALE/NANOSCALE SHIFT REGISTERS

(75) Inventors: Gregory S. Snider, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/331,642

(22) Filed: Dec. 10, 2008

(65) Prior Publication Data

US 2009/0196090 A1    Aug. 6, 2009

Related U.S. Application Data

(62) Division of application No. 11/255,722, filed on Oct. 21, 2005, now Pat. No. 7,525,833.

(51) Int. Cl.
*G11C 11/00* (2006.01)
(52) U.S. Cl. ............... 365/151; 365/63; 365/189.05; 365/189.08; 365/189.12; 257/E51.04
(58) Field of Classification Search ............ 365/151, 365/63, 189.05, 189.08, 189.12
See application file for complete search history.

(56) References Cited

U.S. PATENT DOCUMENTS

| | | | |
|---|---|---|---|
| 5,321,399 A | | 6/1994 | Notani |
| 5,799,211 A | | 8/1998 | Hakkarainen |
| 6,256,767 B1 | * | 7/2001 | Kuekes et al. ............ 716/9 |
| 6,288,585 B1 | * | 9/2001 | Bando et al. ............ 327/156 |
| 6,674,932 B1 | * | 1/2004 | Zhang et al. ............ 385/16 |
| 6,751,365 B2 | * | 6/2004 | Zhang et al. ............ 385/2 |
| 6,777,982 B2 | * | 8/2004 | Goldstein et al. ......... 326/134 |

(Continued)

FOREIGN PATENT DOCUMENTS

WO    WO-03038833    5/2003

(Continued)

OTHER PUBLICATIONS international Search Report; PCT Patent Application No. PCT/US2006/028407, Jul. 21, 2006; search issued by Korean Patent Office (ISA) Dec. 19, 2006.

(Continued)

*Primary Examiner*—Viet Q Nguyen

(57) ABSTRACT

Methods for inputting a data-value pattern into a nanowire crossbar, for inputting a data-value pattern into a nanowire crossbar that support computer instructions stored in a computer-readable medium, and for distributing a received data value to each of a set of nanowires that support control logic implemented in logic circuits are provided. First and second nanoscale shift registers are employed, the first having output signal lines that form or interconnect with a first parallel set of nanowire-crossbar nanowires and the second having output signal lines that form or interconnect with a second parallel set of nanowire-crossbar nanowires. A first pattern of values is stored in the first shift register and a second pattern of values is stored in the second shift register using voltage signals below the WRITE voltage for junctions of the crossbar. Voltage signals greater than or equal to the WRITE threshold are applied for junctions of the crossbar to write the pattern of data values into the crossbar.

12 Claims, 44 Drawing Sheets

U.S. PATENT DOCUMENTS

| | | | |
|---|---|---|---|
| 6,867,427 B2 * | 3/2005 | Zhang et al. | 257/14 |
| 6,870,394 B2 * | 3/2005 | Kuekes | 326/41 |
| 6,919,740 B2 * | 7/2005 | Snider | 326/134 |
| 6,934,424 B2 * | 8/2005 | Zhang et al. | 385/2 |
| 6,990,009 B2 * | 1/2006 | Bertin et al. | 365/151 |
| 7,019,391 B2 * | 3/2006 | Tran | 257/678 |
| 7,051,945 B2 * | 5/2006 | Empedocles et al. | 235/492 |
| 7,187,201 B1 * | 3/2007 | Trimberger | 326/41 |
| 7,203,789 B2 * | 4/2007 | Snider | 710/317 |
| 7,257,016 B2 * | 8/2007 | Snider | 365/151 |
| 7,277,379 B2 * | 10/2007 | Kondo | 369/275.4 |
| 7,302,513 B2 * | 11/2007 | Mouttet | 710/317 |
| 7,307,448 B2 * | 12/2007 | Snider et al. | 326/38 |
| 7,330,369 B2 * | 2/2008 | Tran | 365/151 |
| 7,375,417 B2 * | 5/2008 | Tran | 257/678 |
| 7,387,870 B2 * | 6/2008 | Yoshida et al. | 430/322 |
| 7,517,794 B2 * | 4/2009 | Snider et al. | 438/641 |
| 7,525,833 B2 * | 4/2009 | Snider et al. | 365/151 |
| 2004/0149978 A1 | 8/2004 | Snider | |

FOREIGN PATENT DOCUMENTS

WO    WO-2005006342    1/2005

OTHER PUBLICATIONS

Snider et al., "CMOS-Like Logic in Defective, Nanoscale Crossbars".

Snider et al., "Nanoelectronic Architectures".

Kuekes et al., the Crossbar Latch: Logic Value Storage, Restoration and Inversion in Crossbar Circuits".

Snider et al., "Nano State Machines Using Hysteric Resistors and Diode Crossbars".

Snider et al., "Crossbar Demultiplexers for Nanoelectronics Based on N-Hot Codes".

Snider et al., "Computing with Hysteretic Resistor Crossbars".

* cited by examiner

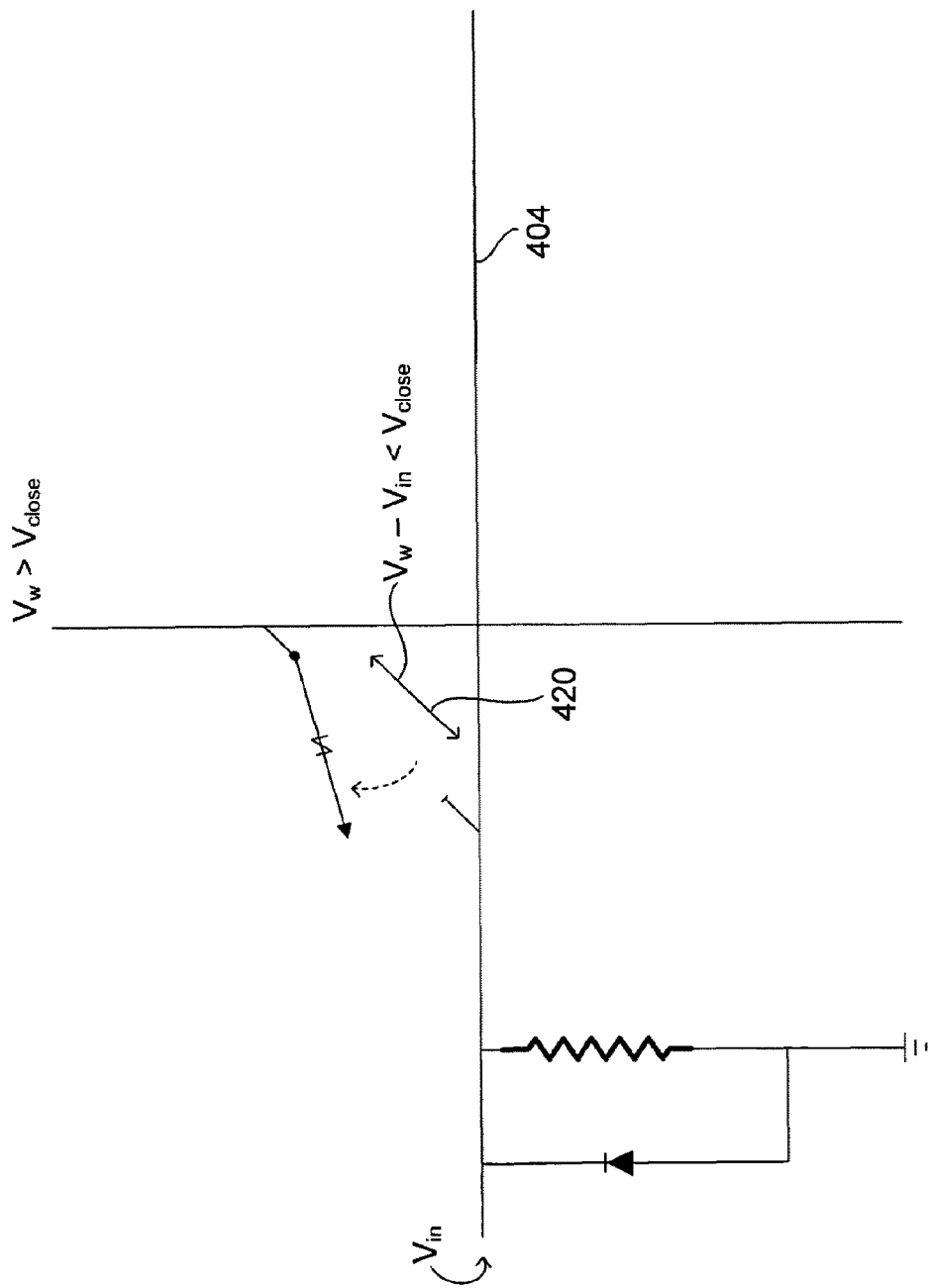

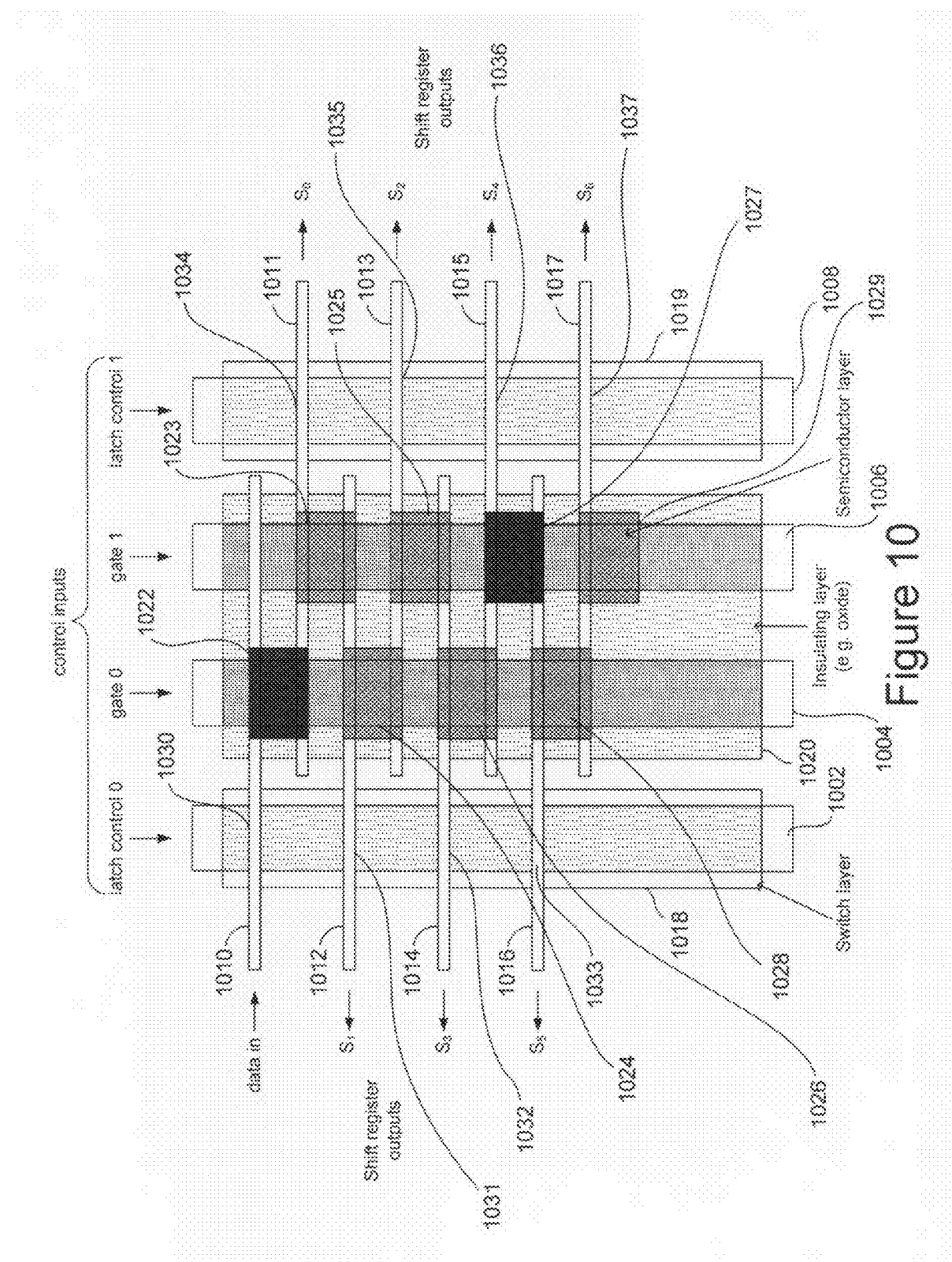

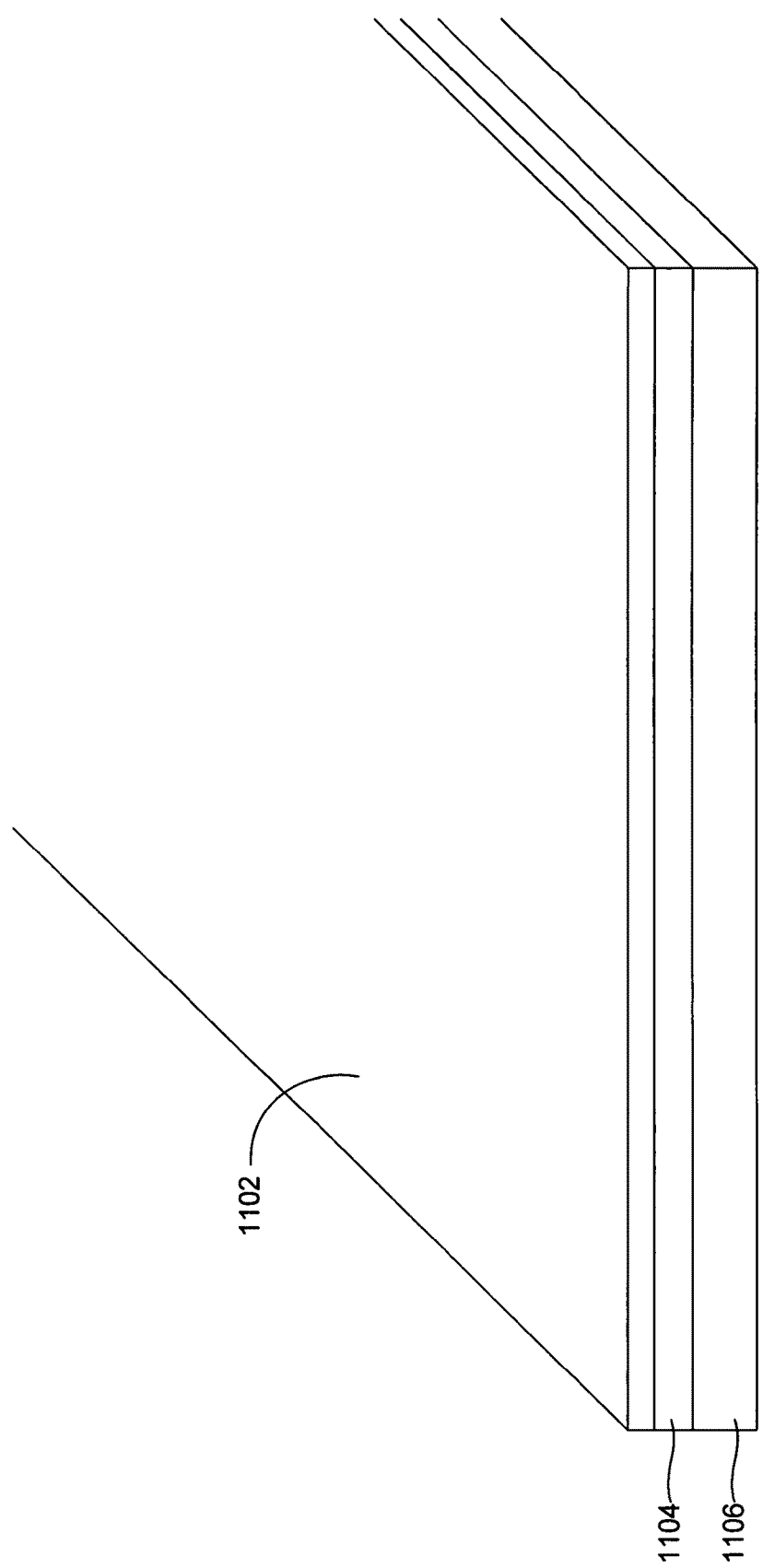

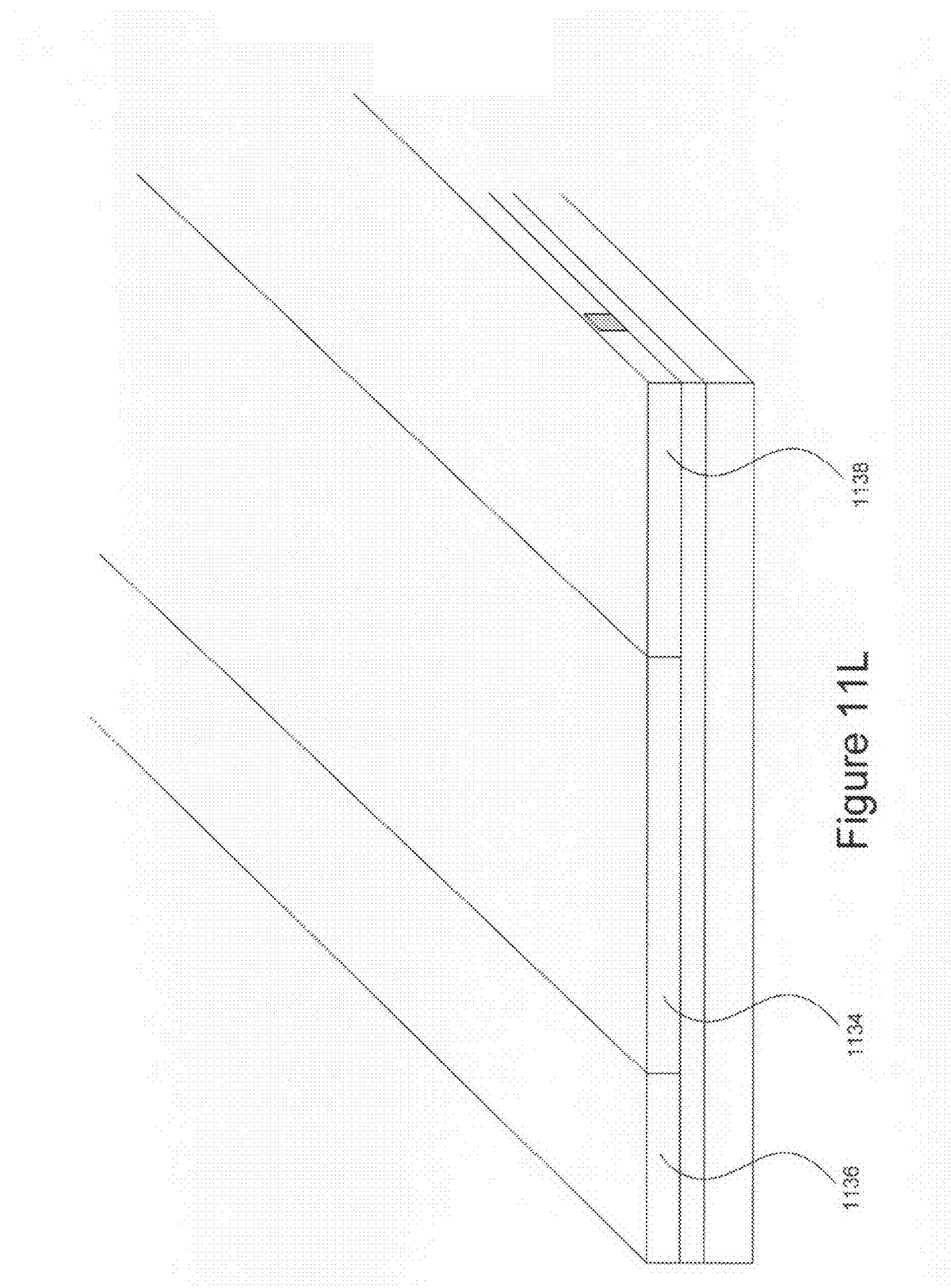

NANOSCALE SHIFT REGISTER AND SIGNAL DEMULTIPLEXING USING MICROSCALE/NANOSCALE SHIFT REGISTERS

CROSS-REFERENCE TO RELATED APPLICATION

The present application is a divisional application of application Ser. No. 11/255,722, filed Oct. 21, 2005, now U.S. Pat. No. 7,525,833 the contents of which are incorporated herein by reference.

TECHNICAL FIELD

The present invention is related to molecular electronics and, in particular, to a nanoscale shift register that employs alternating electrical connections of pairs of nanoscale latches and common latch-control and gate signals, that can be used to distribute an input signal to each of a number of individual nanowires.

BACKGROUND OF THE INVENTION

During the past 70 years, enormous progress in the theoretical foundations of computer science, in materials science and integrated circuit fabrication, and in systems design and integration have led to fantastic increases in the computational power, flexibility, and affordability of computers, along with a surprising and equally fantastic decrease in the sizes of, and power consumption and dissipation by, modern computer systems. A currently available, inexpensive desktop personal computer provides far more computing power than a supercomputer of twenty years ago. Much of the progress in computing can be attributed to a steady increase in the density of circuitry that can be manufactured in integrated circuits resulting from a steady decrease in the widths of signal lines and dimensions of submicroscale electronic components that can be fabricated by photolithographic processes. Unfortunately, the tiny dimensions at which signal lines and submicroscale electronic components can be manufactured may be approaching physical limits to further size decreases. Further increases in the density of fabricated submicroscale electronic components may depend on using very different fabrication strategies, rather than photolithography-based methods. Continued progress in computing may depend either on developing new integrated-circuit-fabrication methods and materials, or may instead depend on finding entirely new strategies for computing, such as quantum computing, massively parallel computer architectures, or other such innovations.

During the past decade, an entirely new fabrication method for nanoscale electronic circuits and nanoscale electronic components has begun to be developed, and has become a foundation of the emerging field of molecular electronics. One promising type of nanoscale-component fabrication process is based on nanoscale crossbars composed of nanowires, and mixed-scale crossbars composed of both microscale signal lines and nanowires with passive and active electronic components, including resistors, diodes, and various types of transistors, fabricated at selected points of overlap between approximately perpendicular nanowires in stacked, orthogonally oriented layers of parallel nanowires, in the case of nanowire crossbars, or overlap between microscale signal lines and nanowires in stacked, orthogonally oriented alternating layers of parallel nanowires and parallel microscale signal lines, in the case of mixed-scale crossbars. Working nanowire-crossbar circuits and mixed-scale crossbar circuits have been fabricated in research laboratories, and have been integrated with conventional submicroscale circuitry to produce tiny, high-density memories and logic circuits. Although nanowire crossbars represent an exciting and promising approach to fabrication of computer components at molecular dimensions, much additional research and development effort is needed for commercial production and integration of nanowire-crossbar-based computer components. Many issues remain concerning the reliability of fabrication of passive and active electronic components at nanowire junctions, and much effort will be needed to efficiently construct dense circuitry at molecular dimensions. Furthermore, it remains a challenge to fabricate robust, inexpensive nanoscale and mixed-scale components, including demultiplexing components, that distribute an input signal to individual nanowires of a set of nanowires. For these reasons, researchers, developers, and manufacturers of submicroscale electronics have recognized the need for simple, nanoscale circuit and mixed-scale-circuit components, such as demultiplexers or other signal-distributing components, to allow signals to be directed to individual nanowires within a nanoscale or mixed-scale circuit.

SUMMARY OF THE INVENTION

One embodiment of the present invention is a nanoscale shift register that can be used, in certain nanoscale and mixed-scale logic circuits, to distribute an input signal to individual nanowires of the logic circuit. In a described embodiment, the nanoscale shift register includes two series of nanoscale latches, each series controlled by common latch-control signals. Internal latches of each series of latches are alternatively interconnected with a previous latch of the other series and a next latch of the other series by two series of gates, each controlled by a gate signal line.

BRIEF DESCRIPTION OF THE DRAWINGS

FIGS. 5A-5E illustrate operation of the nanoscale latch shown in FIG. 4.

FIG. 10 illustrates a nanoscale shift register that represents one embodiment of the present invention.

DETAILED DESCRIPTION OF THE INVENTION

Embodiments of the present invention are directed to nanoscale shift registers, and methods for fabricating nanoscale shift registers. The nanoscale shift registers of the present invention may find particular utility for demultiplexing input signals to individual nanowires of a mixed nanoscale circuit or a nanoscale circuit. The term "nanoscale" refers to a component dimension of less than 100 nm. In certain cases, the component dimension may be less than 50 nm, and in other cases, the component dimension may be less than 10 nm. Certain of the described embodiments are mixed-scale shift registers, in which one or more of the latch-control or gate signal lines are microscale, or sub-microscale signal lines, rather than nanoscale signal lines. In this discussion, the phrase "nanoscale shift register" refers to either mixed-scale shift registers that include a significant number of nanoscale components, to mixed-scale shift registers that include mostly nanoscale components, or to shift registers that contain only nanoscale components. In the described embodiments, below, a single bit of data is successively transferred between pairs of nanoscale latches. In a first subsection, below, nanoscale latches based on hysteretic resistors, and data transfer operations between paired nanoscale latches, is first described. It should be noted that these described nanoscale latches are only one of many possible nanoscale-latch implementations. Additional types of nanoscale latches may be based on non-linear resistors, various types of nanoscale diodes, transistors, and other types of familiar electronic components and microscale-electronic-component analogs at the nanoscale, as well as on new types of devices. Although the first subsection describes nanoscale latches, the operation and function of the nanoscale latches employed in described embodiments of the present invention that include microscale latch-control signal lines are essentially identical. Following the first subsection, a second subsection describes one embodiment of a nanoscale shift register, and a method for fabricating the nanoscale shift register. A final subsection describes signal demultiplexing in a mixed-scale or nanoscale logic circuit using a nanoscale shift register representing one embodiment of the present invention.

Paired Nanoscale Latches Joined by a Data Signal Bus

Figure 1A:
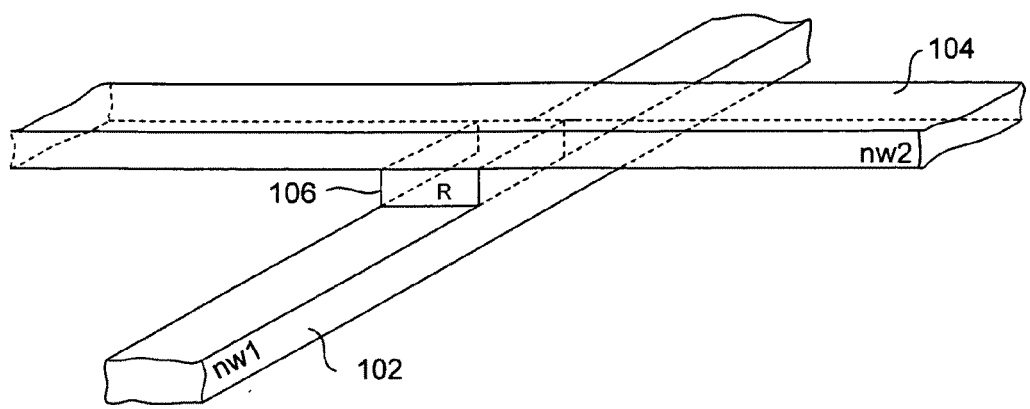
FIGS. 1A-1C provide different illustrations of a resistive nanowire junction.
Figure 1B:
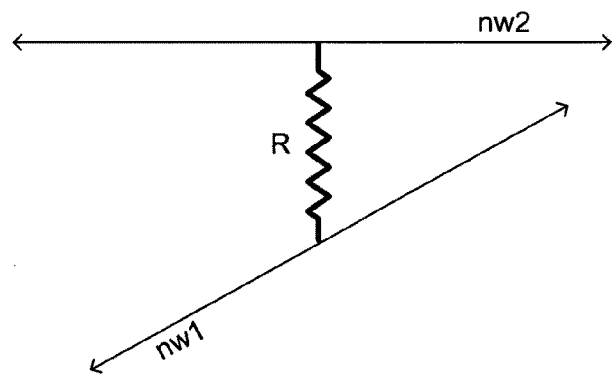
Figure 1C:
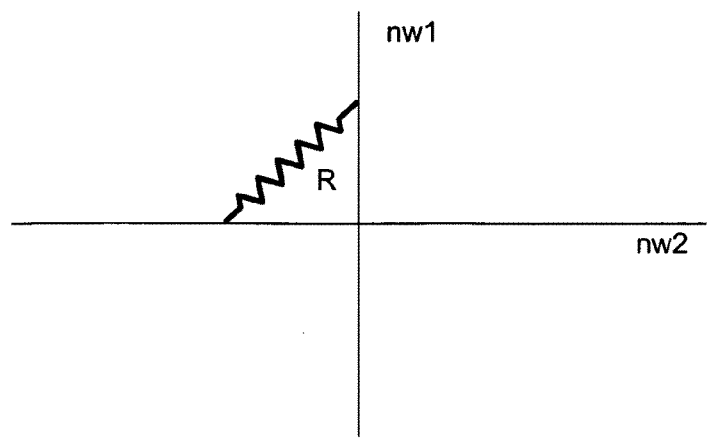

FIGS. 1A-1C provide different illustrations of a resistive nanowire junction. In FIG. 1A, a physical representation of the resistive nanowire junction is provided to represent a picture of a resistive, nanowire junction that might be obtained were optical microscopes of sufficient power available to image nanowire junctions. As shown in FIG. 1A, a first nanowire 102 underlies a second nanowire 104, with the two nanowires 102 and 104 approximately perpendicular to one another. A resistive element 106 lies between the two nanowires, in the region of overlap between the two nanowires. Nanowires may be composed of a few, parallel strands of a conducting polymer, a carbon nanotube, a polymer-like chain of metal or semiconductor atoms or molecules, or other conducting or semiconducting materials that can be fabricated at molecular dimensions. The shapes and cross-sectional geometries of nanowires are determined by the molecules that compose them, but generally are complex at molecular dimensions, rather than the simple rectangular shapes shown in FIG. 1A. The resistive element 106 that lies between the two nanowires at their point of closest contact may be composed of one or a small number of molecules that behave as an electrical resistor. A voltage can be applied across a nanowire junction so that an amount of current flows through the junction that is proportional to the applied voltage and inversely proportional to the resistance of the resistive element 106, according to Ohm's Law, assuming linear resistance. Often, resistive nanowire junctions exhibit non-linear resistance, with more complex relationships between current flow and applied voltage. FIG. 1B shows a more schematic illustration of the resistive nanowire junction shown in FIG. 1A. FIG. 1C shows a fully schematic illustration of the resistive nanowire junction shown in FIG. 1A. The schematic convention shown in FIG. 1C is employed throughout the remaining figures to represent resistive nanowire junctions.

One particularly important type of resistive junction that can be fabricated by currently available techniques is a hysteretic, resistive nanowire junction. The resistance of a hysteretic, resistive nanowire junction can be controlled, by application of state-transition voltages to the hysteretic, resistive nanowire junction, the resistance alternating between two, bistable resistivity states. In one resistivity state, the nanowire junction has a relatively low resistance, or impedance, and in the other resistivity state, the nanowire junction has a relatively high resistance or impedance. In the current discussion, the time-dependent behavior of nanowire junctions resulting from internal capacitances and other properties is ignored, and the terms "resistance" and "impedance" are therefore interchangeable.

Figure 2:
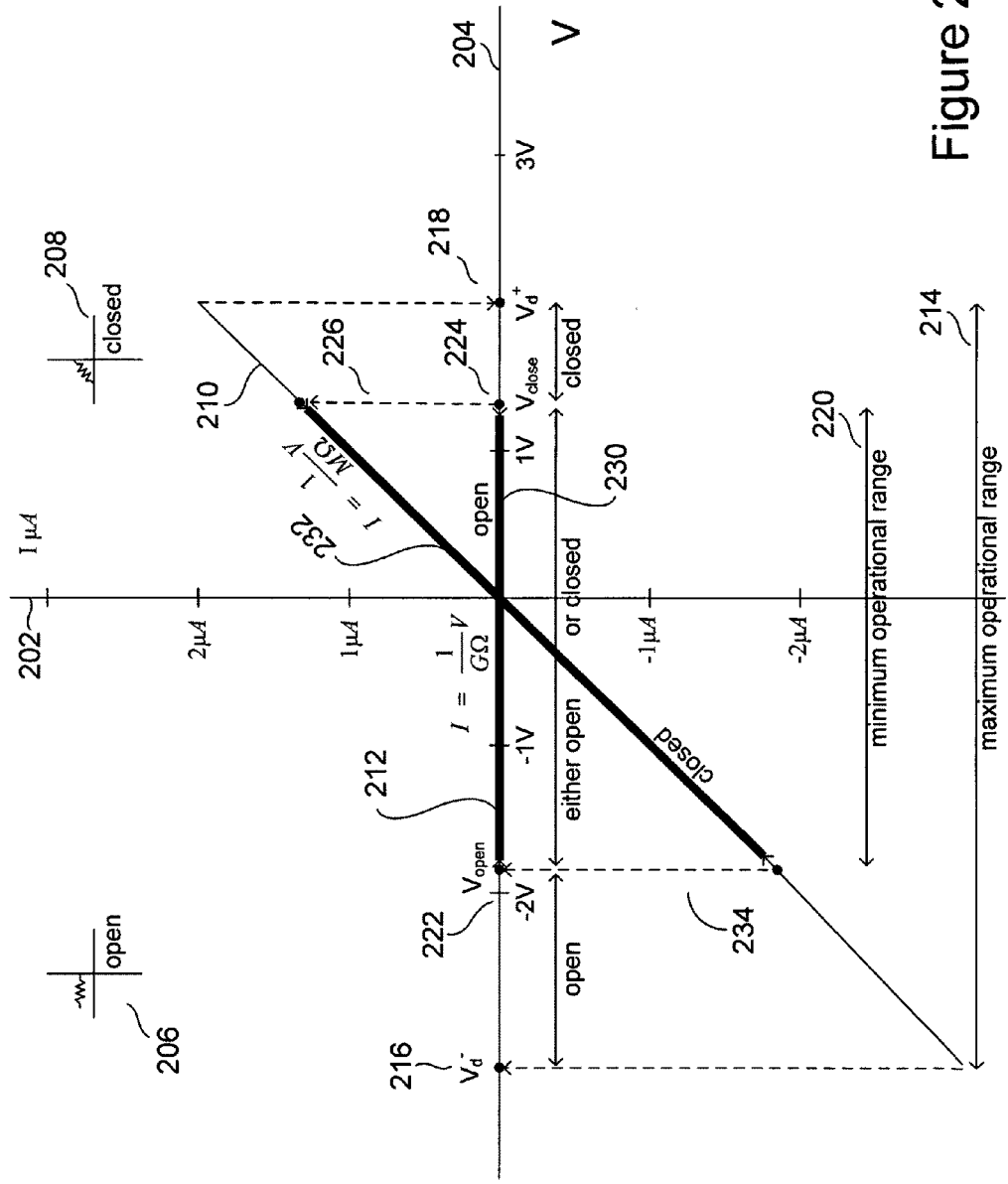
FIG. 2 shows the bistable resistivity states of a hysteretic, resistive nanowire junction and resistivity-state transitions under operational control voltages.

FIG. 2 shows the bistable resistivity states of a hysteretic, resistive nanowire junction and resistivity-state transitions under operational control voltages. FIG. 2 shows plotted current/voltage relationships with respect to a vertical current axis 202 and a horizontal voltage axis 204. The vertical current axis is incremented in microamperes ($\mu A$), and the voltage axis 204 is incremented in volts (V). The high resistivity state of the hysteretic, resistive nanowire junction is referred to as the "open" state, schematically represented by the open-switch-like representation of the nanowire junction 206 above a portion of the negative voltage axis. The low resistivity state of the hysteretic, resistive nanowire junction is referred to as the "closed" state, represented by the closed-switch-like schematic 208 shown in FIG. 2 above the positive portion of the voltage axis. FIG. 2 shows the operational characteristics of an actual hysteretic, resistive nanowire junction prepared in the laboratory. The current/voltage relationship for the closed state is plotted as straight line segment 210, and the current/voltage relationship of the open state is plotted as straight line segment 212, imperceptivity positively slanted with respect to the horizontal axis. In the closed state, the hysteretic, resistive nanowire junction has a resistance on the order of mega Ohms, and, in the open state, the hysteretic, resistive nanowire junction has a resistance on the order of giga Ohms.

The maximum operational voltage range 214 for the hysteretic, resistive nanowire junction ranges from just above a negative destructive voltage $V_4^-$ 216 to just below a positive destructive voltage $V_d^+$ 218. When the hysteretic, resistive nanowire junction is in the open, high-resistivity state, the voltage can range over a minimum operational voltage range 220 without the hysteretic, resistive nanowire junction undergoing a resistivity-state transition to the closed state. The minimum operational range ranges from the negative voltage $V_{open}$ 222 to the positive voltage $V_{close}$ 224. As the applied voltage increases to $V_{open}$ 224, the hysteretic, resistive nanowire junction abruptly transitions 226 to the closed state, represented in FIG. 2 by the dashed arrow 226 interconnecting the end points of the two voltage segments 230 and 232 representing the operational voltage-range segments of the open and closed current/voltage relationships, respectively. The voltage can be increased above $V_{close}$ up to just below the destructive positive voltage $V_d^+$, after which point further voltage increase would irreversibly destroy the hysteretic, resistive nanowire junction. As the voltage is decreased, while the hysteretic, resistive nanowire junction is in the closed state, the corresponding current flow decreases to zero and then begins to increase in the opposite direction. As the applied negative voltage approaches $V_{open}$ in magnitude, the hysteretic, resistive nanowire junction abruptly transitions from the closed state to the open state, as represented by the dashed, vertical arrow 234 in FIG. 2. The voltage can be further decreased, with the hysteretic, resistive nanowire junction remaining in the open state, until the negative voltage $V_d^-$ is reached, after which point a further decrease in voltage irreversibly destroys the hysteretic, resistive nanowire junction.

The hysteretic, resistive nanowire junction therefore occupies the open state, or high resistivity state, between voltages $V_d^-$ and $V_{open}$, at the extreme negative voltage portion of the maximum operational voltage range, occupies the closed state, or low resistivity state, in the extreme positive voltage portion of the maximum operational voltage range, between voltages $V_{close}$ and $V_d^+$, and can occupy either of the open or closed states throughout the minimum operational voltage range 220, depending on the last state transition that occurred, either the closed-state-to-open-state transition 234 or the open-state-to-closed-state transition 226.

Figure 3A:
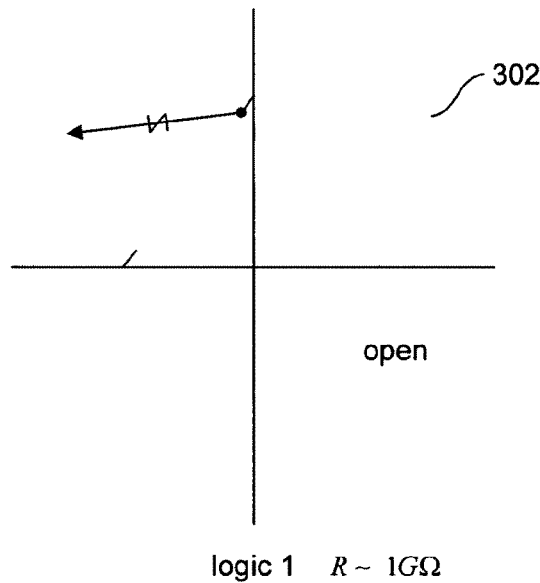
FIGS. 3A-3B schematically illustrate storage of a single bit of data within a hysteretic, resistive nanoscale junction.
Figure 3B:
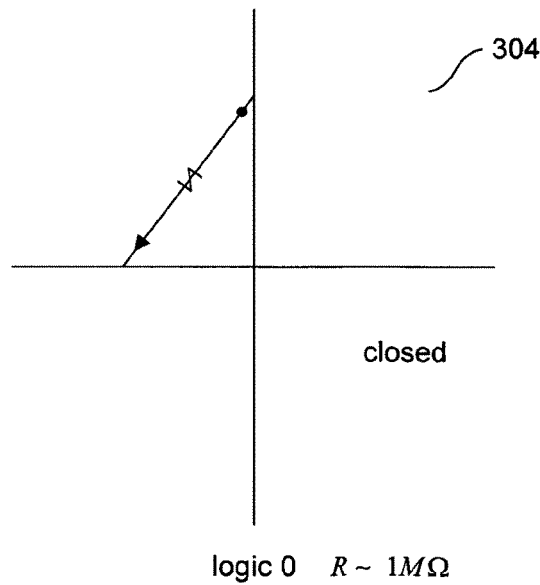

FIGS. 3A-3B schematically illustrate storage of a single bit of data within a hysteretic, resistive nanoscale junction. The open state 302, represented as an open switch, corresponds to the high-resistivity state of the hysteretic, resistive nanowire junction, and may be assigned either logical value "1" or logical value "0." For the initial portion of this discussion, the open state is arbitrarily assigned the logical value "1." The open state, in one embodiment prepared in the laboratory, has a resistance of 1 GΩ. The closed state 304 has, in the prepared embodiment, a resistance of 1 MΩ, and is assigned a logical value "0."

Figure 4:
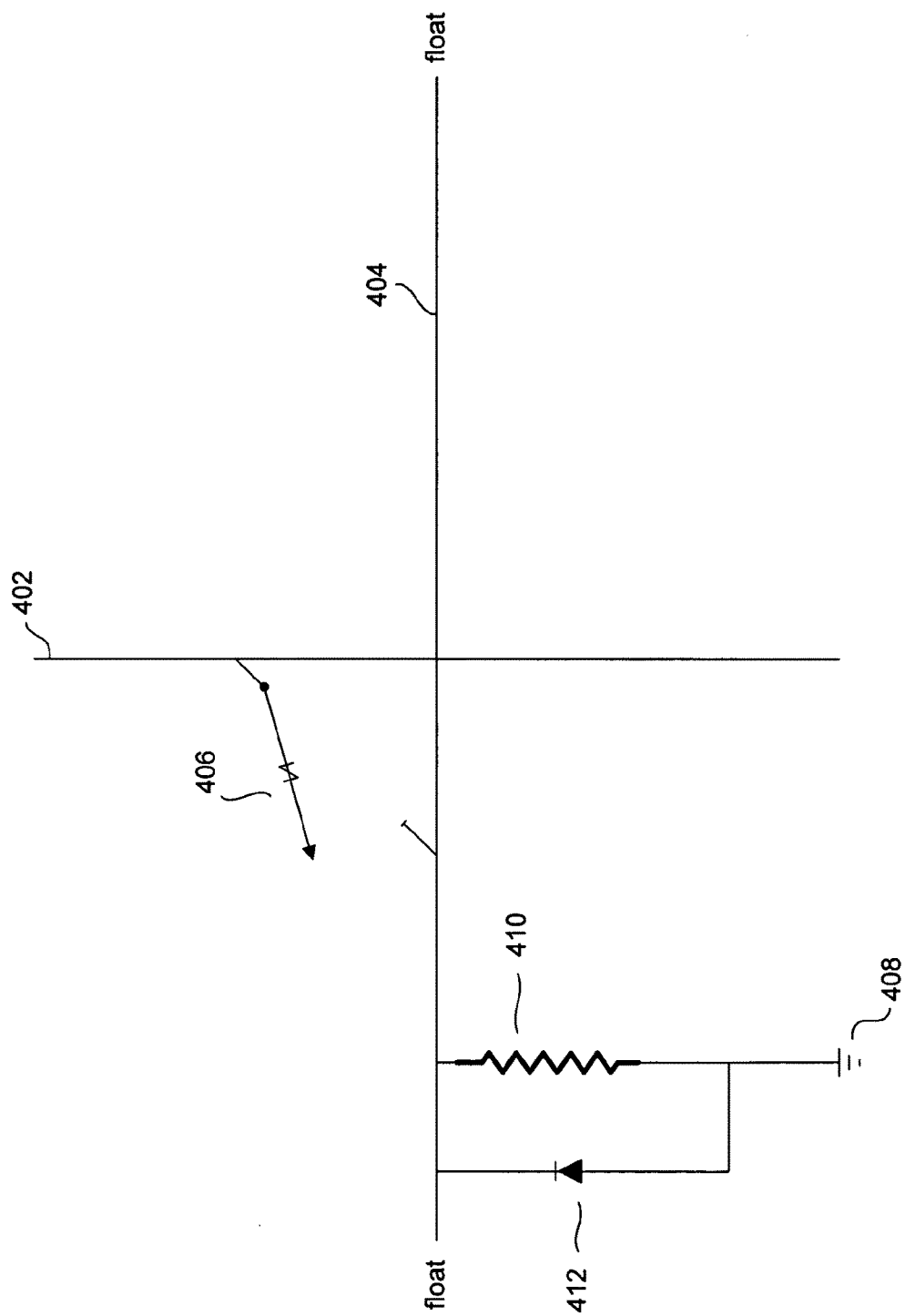
FIG. 4 shows a nanoscale latch.

A hysteretic, resistive nanowire junction, along with additional components, can be employed as a nanoscale latch, or a one-bit register. FIG. 4 shows a nanoscale latch. The nanoscale latch includes a control line 402 and a single-bit data bus 404. At the overlap between the vertical control line 402 and the single-bit nanowire bus 404 is a hysteretic, resistive nanowire junction 406. The single-bit, nanowire data bus, referred to subsequently in the discussion as the data bus, is additionally connected to ground 408 via a parallel resistor 410 and diode 412. A mixed-scale nanowire latch may employ a microscale control line, rather than a nanowire control line. Such mixed-scale nanowire latches are used in a subsequently described nanoscale shift register that represents one embodiment of the present invention.

Figure 5A:
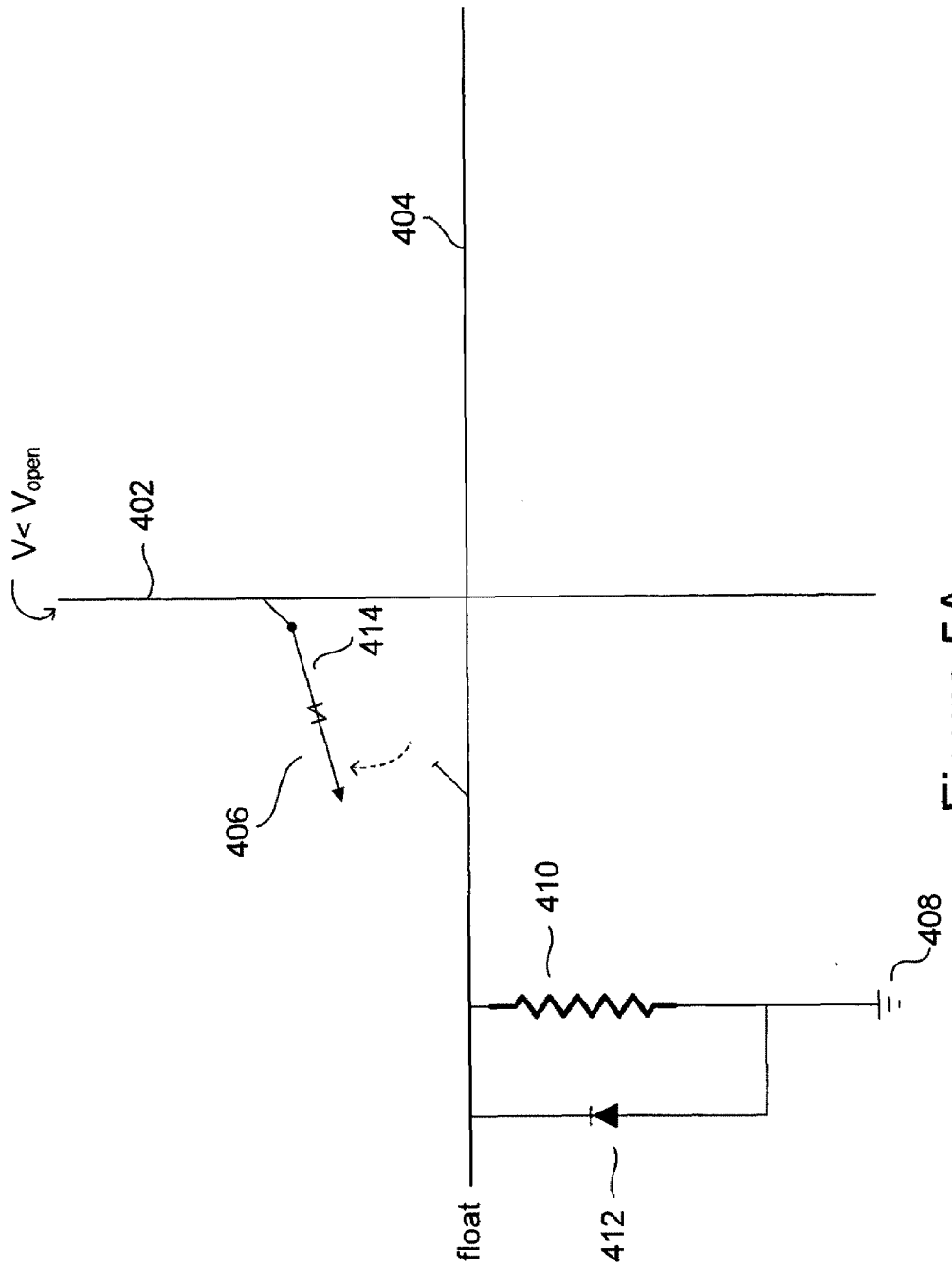

FIGS. 5A-5E illustrate operation of the nanoscale latch shown in FIG. 4. In order to store a logical value in the nanoscale latch, the nanoscale latch is first opened, as shown in FIG. 5A, either by applying a negative voltage less than $V_{open}+V_{diode}$, where $V_{diode}$ is the voltage drop across a forward-biased diode, to the control line 402 while the data bus 404 is connected to ground through a very high resistance connection in parallel with a diode that is forward biased when V is negative, or by applying a negative voltage less than $V_{open}$ to the control line 402 while the data bus 404 is uncoupled with other components or signal lines, referred to as a "floating" state. For silicon diodes, $V_{diode}$ may have a value of approximately 0.7 volts. When the nanoscale latch is in the closed state, application of the negative voltage forces the state transition (234 in FIG. 2) to the open state 406. When the nanoscale latch is in the open state, it remains in the open state. It is during the open step illustrated in FIG. 5A that the diode 412 is needed. Were the diode not present, the resistor 410 and the resistive nanowire junction 414 would together form a voltage divider, and, in order to drop $V_{open}$ across the nanowire junction 414, in the case that the resistance of the junction and the resistor 410 are equal, a negative voltage of $2 \times V_{open}$ would need to be applied to the control line 402. However, as soon as the nanoscale latch began to open, the entire $2 \times V_{open}$ negative voltage would end up being dropped across the resistive nanowire junction. In general, this large-magnitude negative voltage would exceed $V_d^-$, the negative destruction voltage, and would destroy the resistive nanowire junction. Therefore, the diode 412 in parallel with the resistor 410 ensures that, when a negative voltage is applied to the control line 402, the voltage drop divides between the diode and the hysteretic, resistive nanowire junction. The diode 412 allows current flow only when current is flowing from ground 408 to the negative voltage driver driving the control line 402.

Once opened, the nanoscale latch is ready to receive a bit of information. When the data bus 404 is interconnected with ground 418, representing logical value 0, and when a write voltage $V_{write}$ greater than the voltage $V_{close}$ is applied to the vertical control line 402, then a sufficient, positive voltage drops across the hysteretic, resistive junction to cause the state transition (226 in FIG. 2) from the open state to the closed state. As discussed with respect to FIG. 3B, the closed state presents logic 0. Thus, when a logic "1" value is input to the data bus 404, a logical value "0" is stored in the nanoscale latch. The nanoscale latch is thus an inverting latch, storing a value opposite from the value input to the data bus. Conversely, as shown in FIG. 5C, when a logical value "0," represented by a voltage $V_{in}$ greater than the difference between $V_{write}$ and $V_{close}$, is supplied to the data bus 404, the voltage drop across the hysteretic, resistive nanowire junction 420 is less than $V_{close}$, and the nanoscale latch remains open. In other words, a logic "0" value input to the data bus results in storage of a logic "1" value in the inverting, nanoscale latch.

Figure 5B:
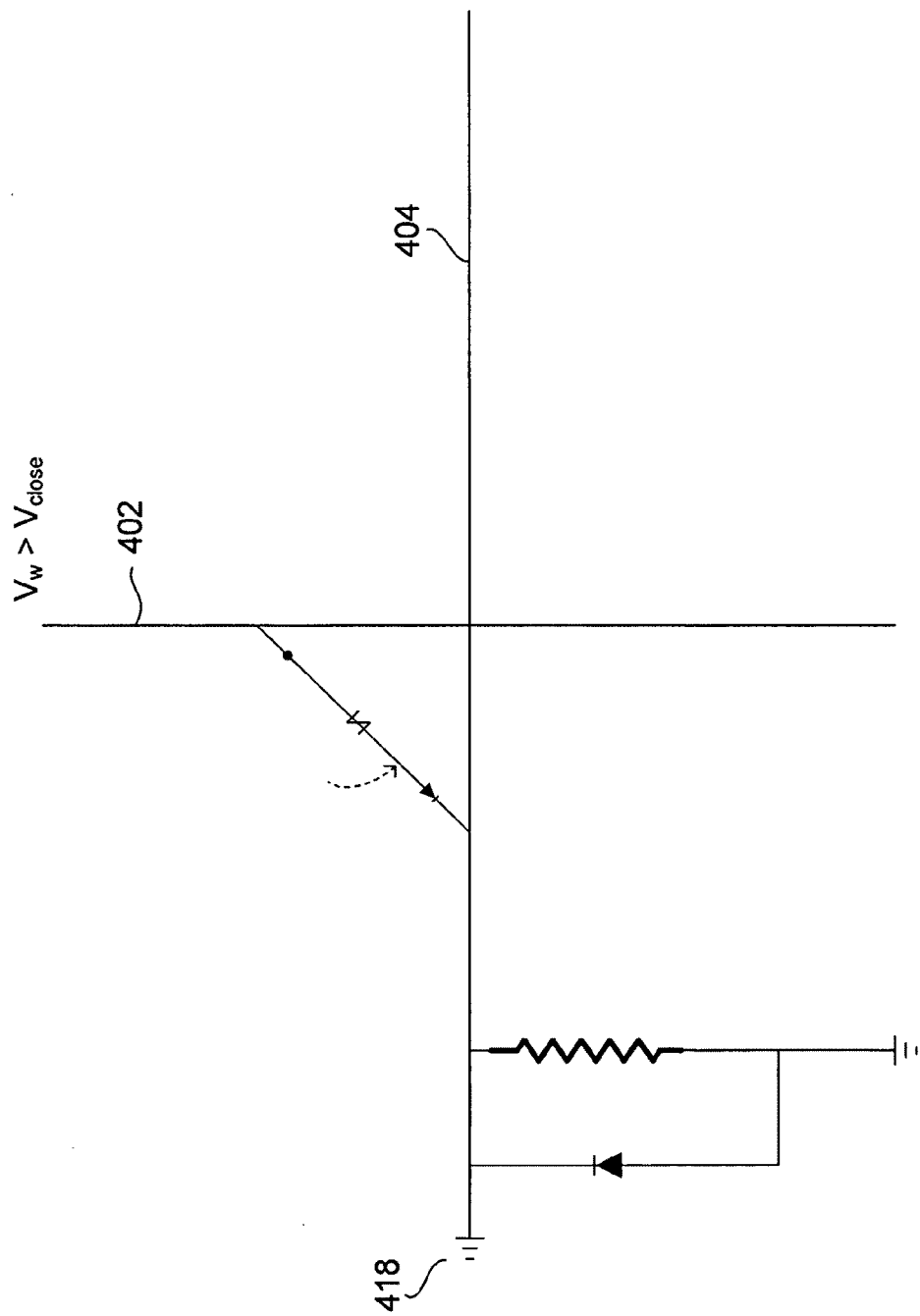
Figure 5D:
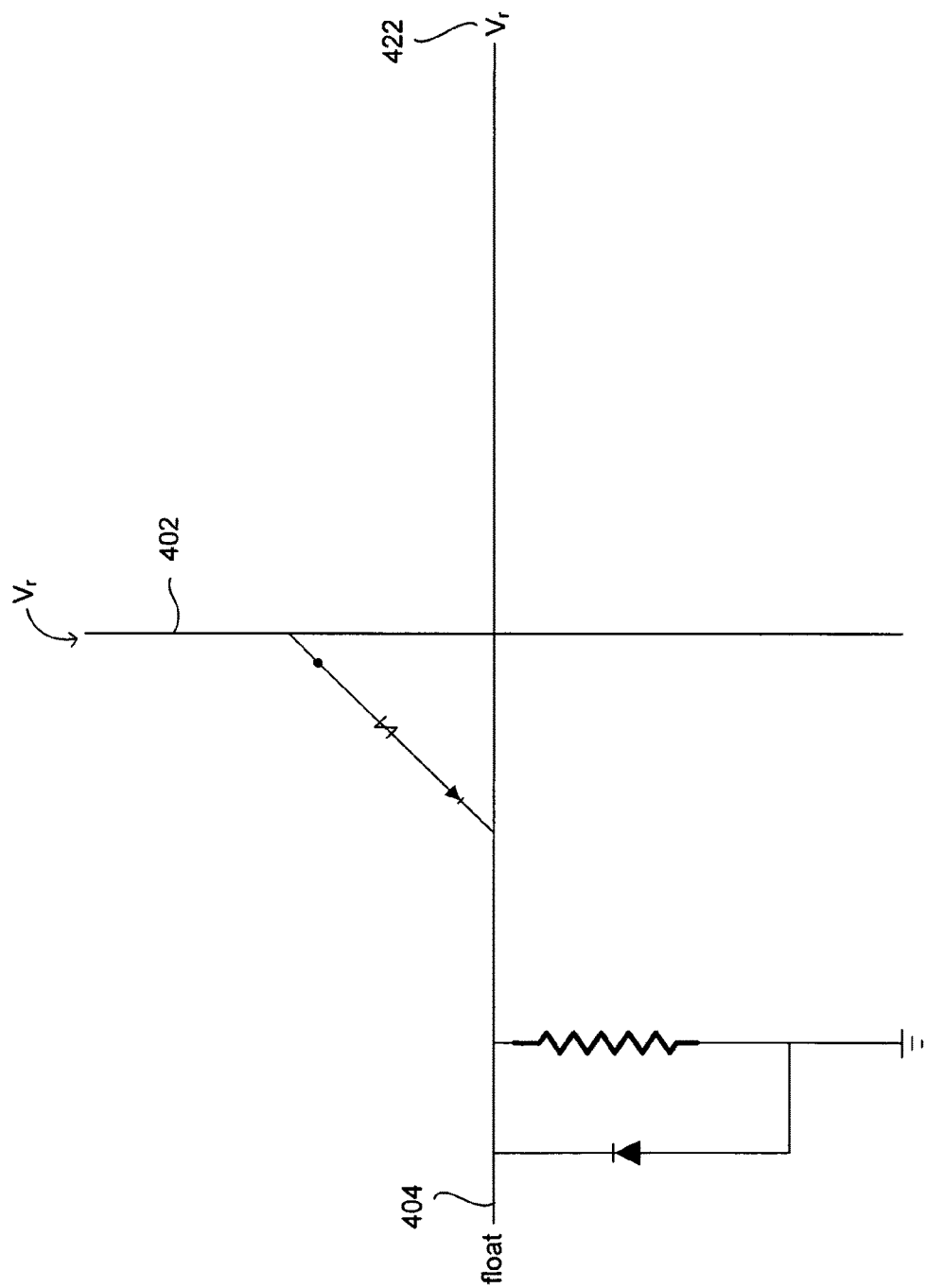
Figure 5E:
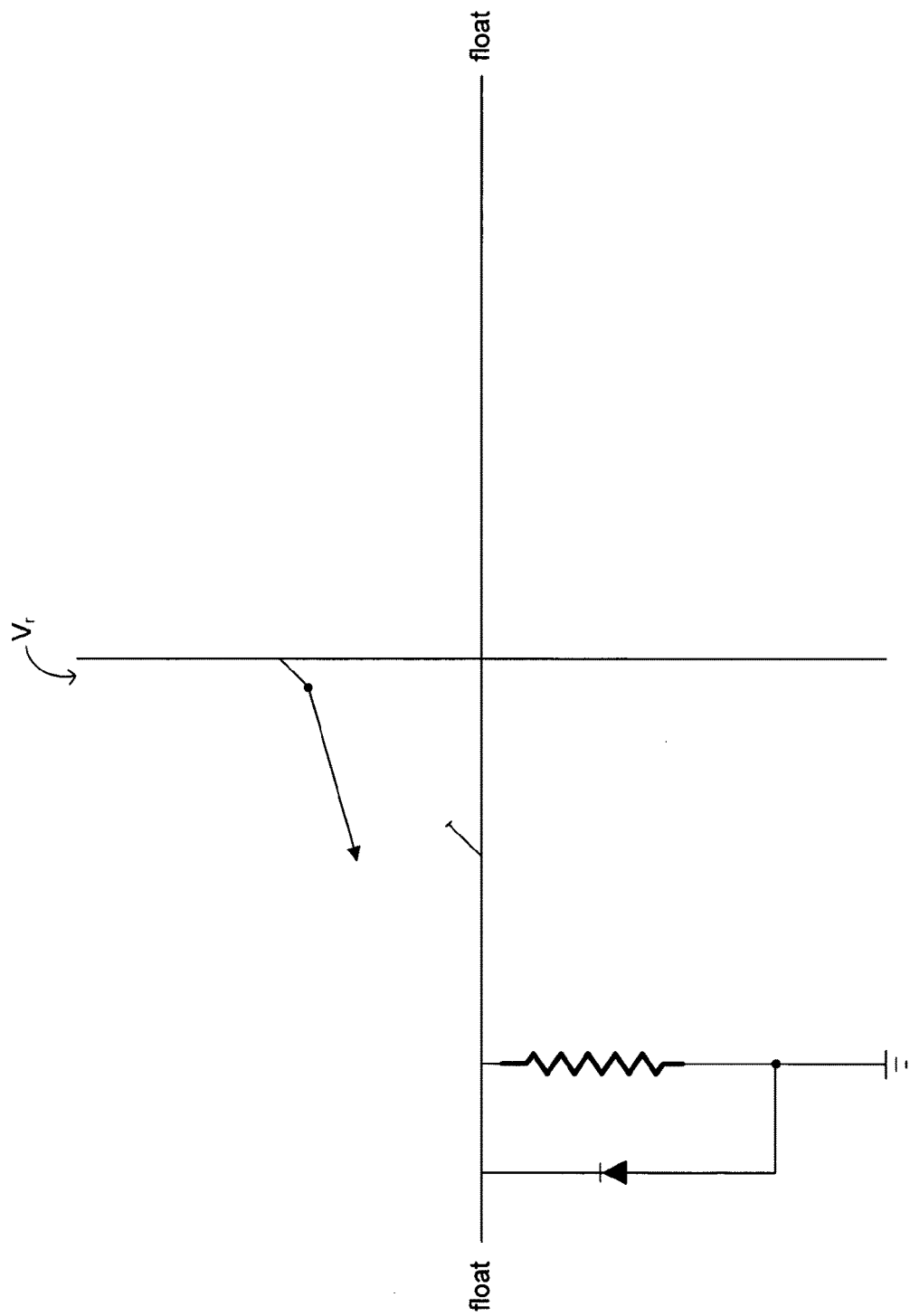

The nanoscale latch is read, as illustrated in FIGS. 5D-5E. A read voltage $V_{read}$ is input to the vertical control line 402, while the data bus is placed in the floating state 404. When the nanoscale latch is closed, or in the low resistance state, then a logical value "0," represented by a positive voltage somewhat less than the read voltage $V_{read}$ is output 422. On the other hand, as shown in FIG. 5E, if the nanoscale latch is open, then the output value of the data bus is the floating state, representing the logical value "1." Thus, the contents of the nanoscale latch can be accessed as a voltage state on the data bus, in response to application of a read voltage $V_{read}$ in the vertical control line.

Figure 6A:
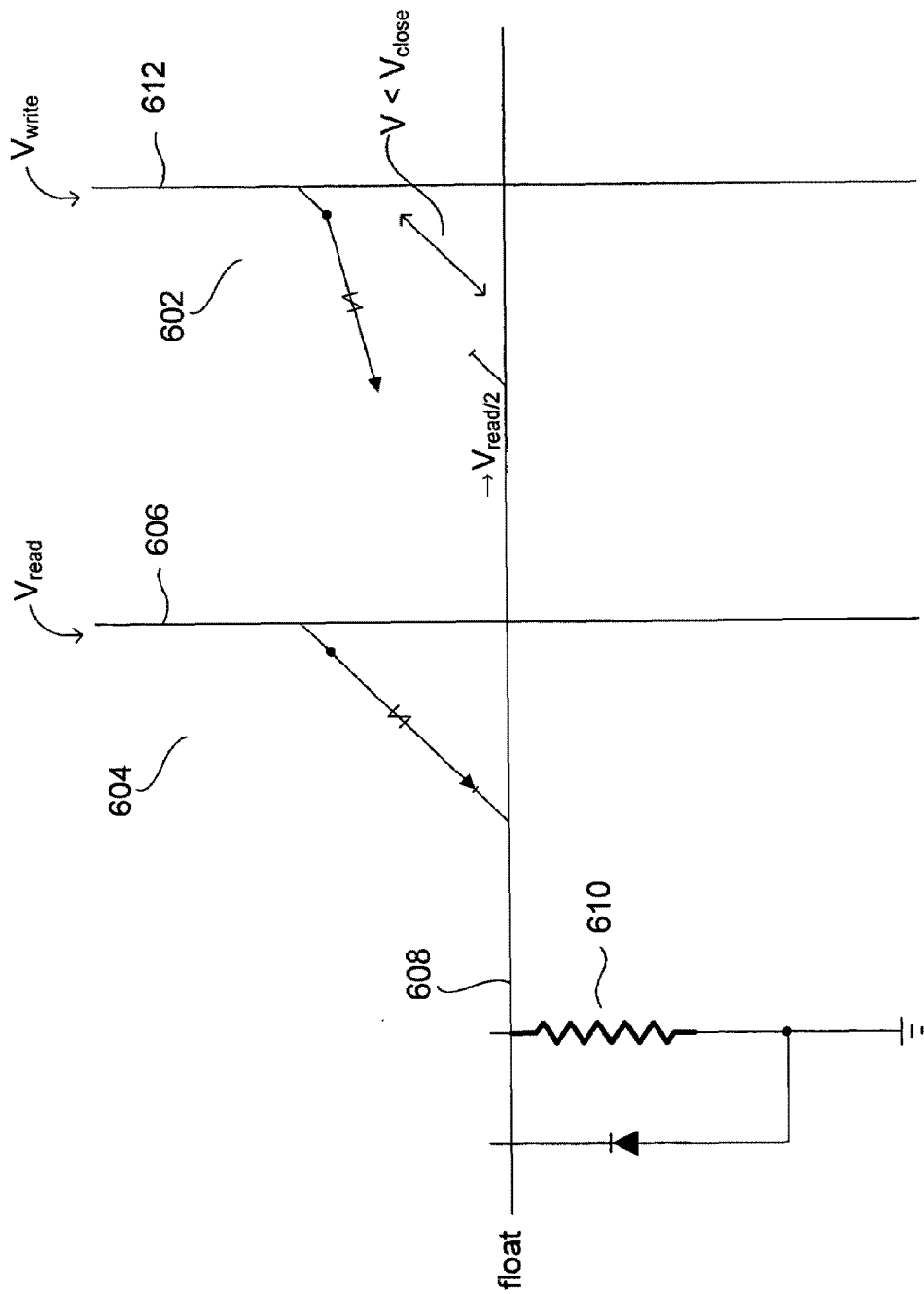
FIGS. 6A-6B illustrate transfer of a data value from a first nanoscale latch to a second nanoscale latch on a nanowire data bus.
Figure 6B:
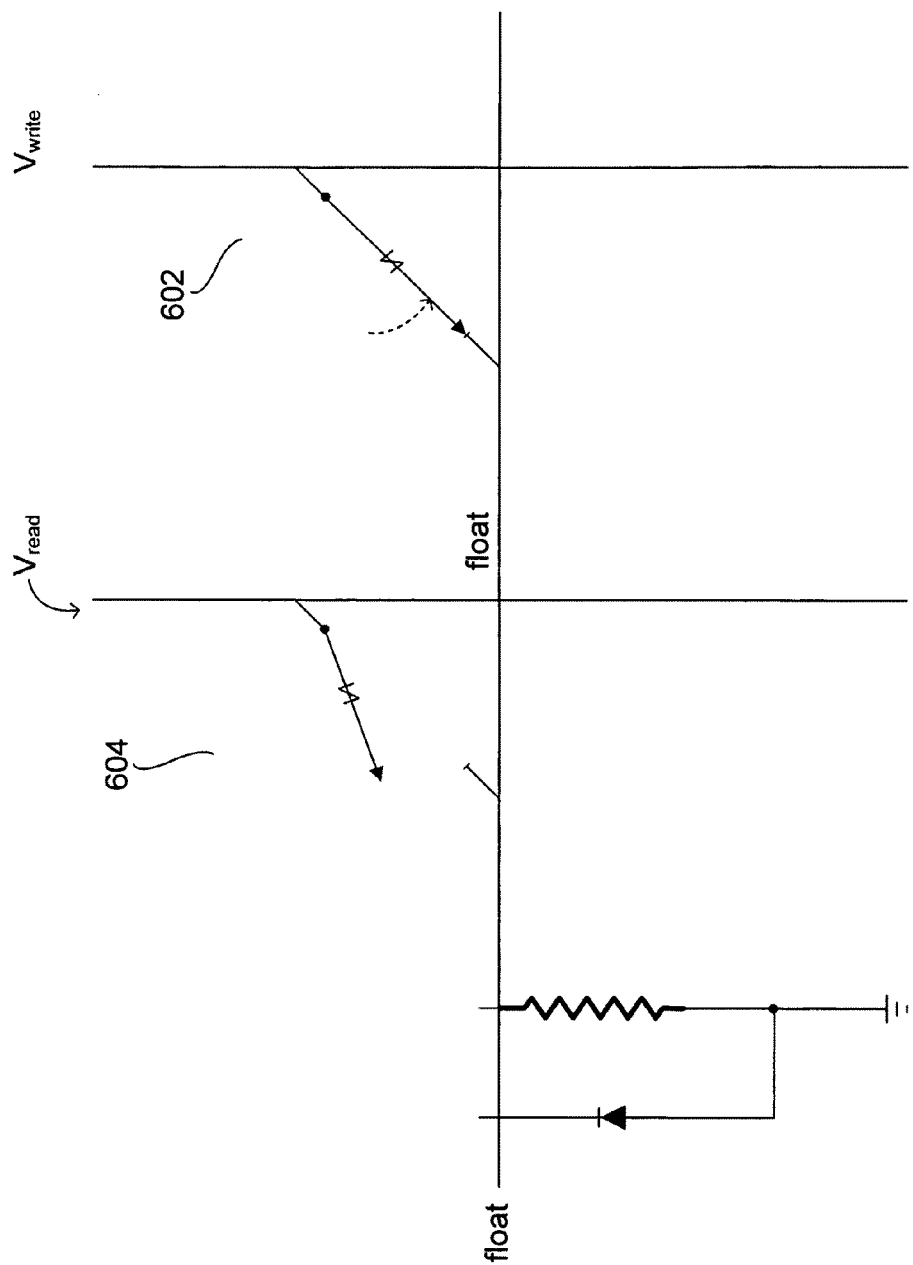

FIGS. 5A-5C illustrate storing a data bit in a nanoscale latch by inputting the data bit from an external source via the data bus. A data value can also be transferred from a first nanoscale latch on the data bus to a second nanoscale latch on the data bus. FIGS. 6A-6B illustrate transfer of a data value from a first nanoscale latch to a second nanoscale latch on a nanowire data bus. In FIG. 6A, the second, or target nanoscale latch 602 is in an open position in preparation for receiving a data value, the nanoscale latch having been opened by the method discussed above with respect to FIG. 5A. The source, or first nanoscale latch 604 is closed, and a read voltage $V_{read}$ is applied to the control line 606 of the source nanoscale latch.

The data bus is allowed to float 608. Because the source nanoscale latch is closed, representing a logical value "0," the voltage $V_{read}/2$ is output to the data bus 608, in the case that resistor 610 has approximately the same resistance value as the hysteretic, resistive nanowire junction 604. A positive voltage $V_{write}$ is applied to the vertical control line 612 of the target nanoscale latch 602, in order to store the value on the data bus, $V_{read}/2$, into the nanoscale latch. Because the total voltage drop across the target hysteretic, resistive nanowire junction, $V_{write}-V_{read}/2$, 602 is less than $V_{close}$, the target nanoscale latch remains in the open position, representing the logical value "1." Thus, the inverting target nanoscale latch stores the opposite value from the logical value stored in the source nanoscale latch 604. As shown in FIG. 6B, when the source nanoscale latch is open, representing the logical value "1," then the voltage drop across the target nanoscale latch 602 is greater than $V_{close}$, and the target nanoscale latch transitions to the close state (226 in FIG. 2), storing the opposite logical value from the logical value stored in the source nanoscale latch.

Figure 7A:
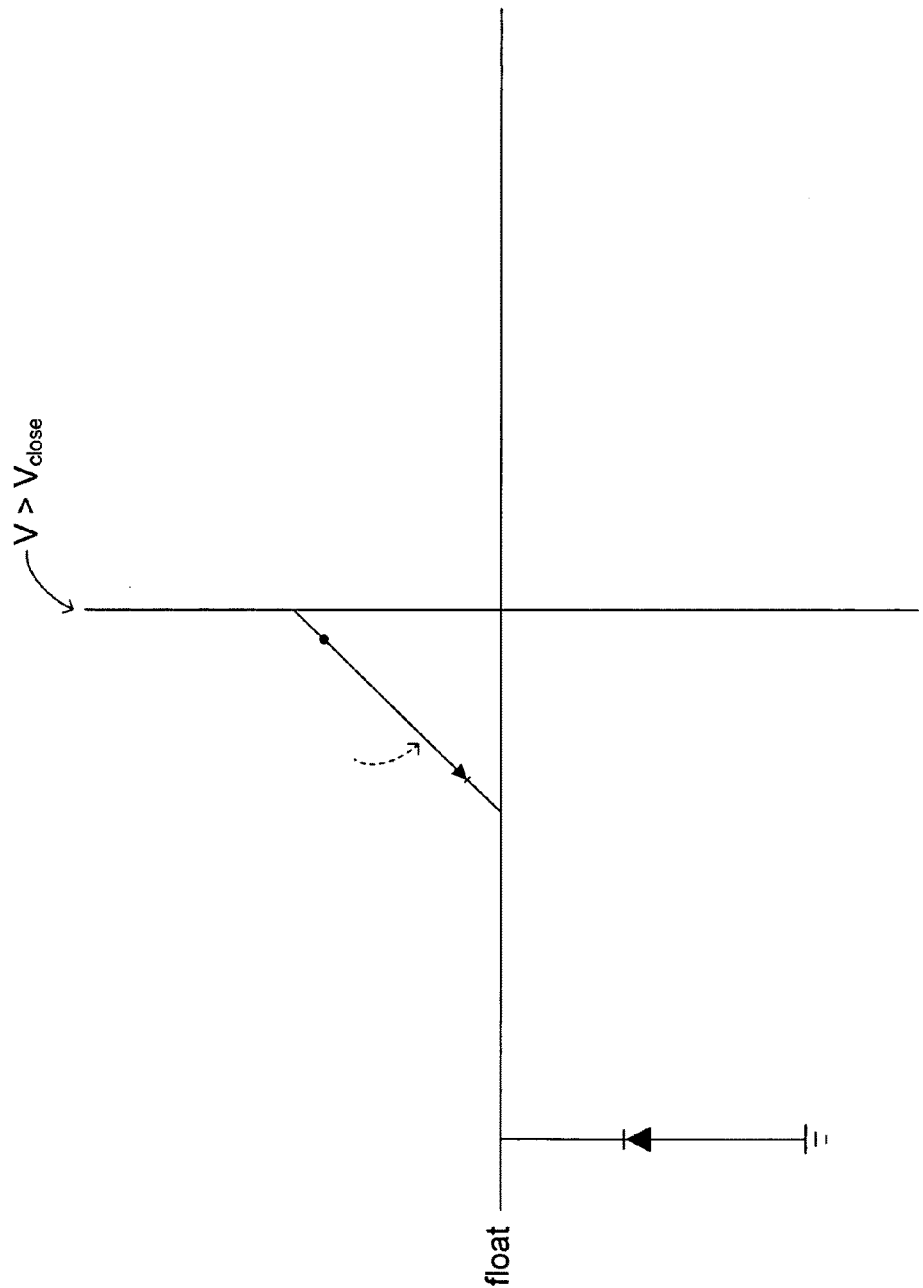
FIGS. 7A-7C illustrate operation of a non-inverting nanoscale latch.
Figure 7B:
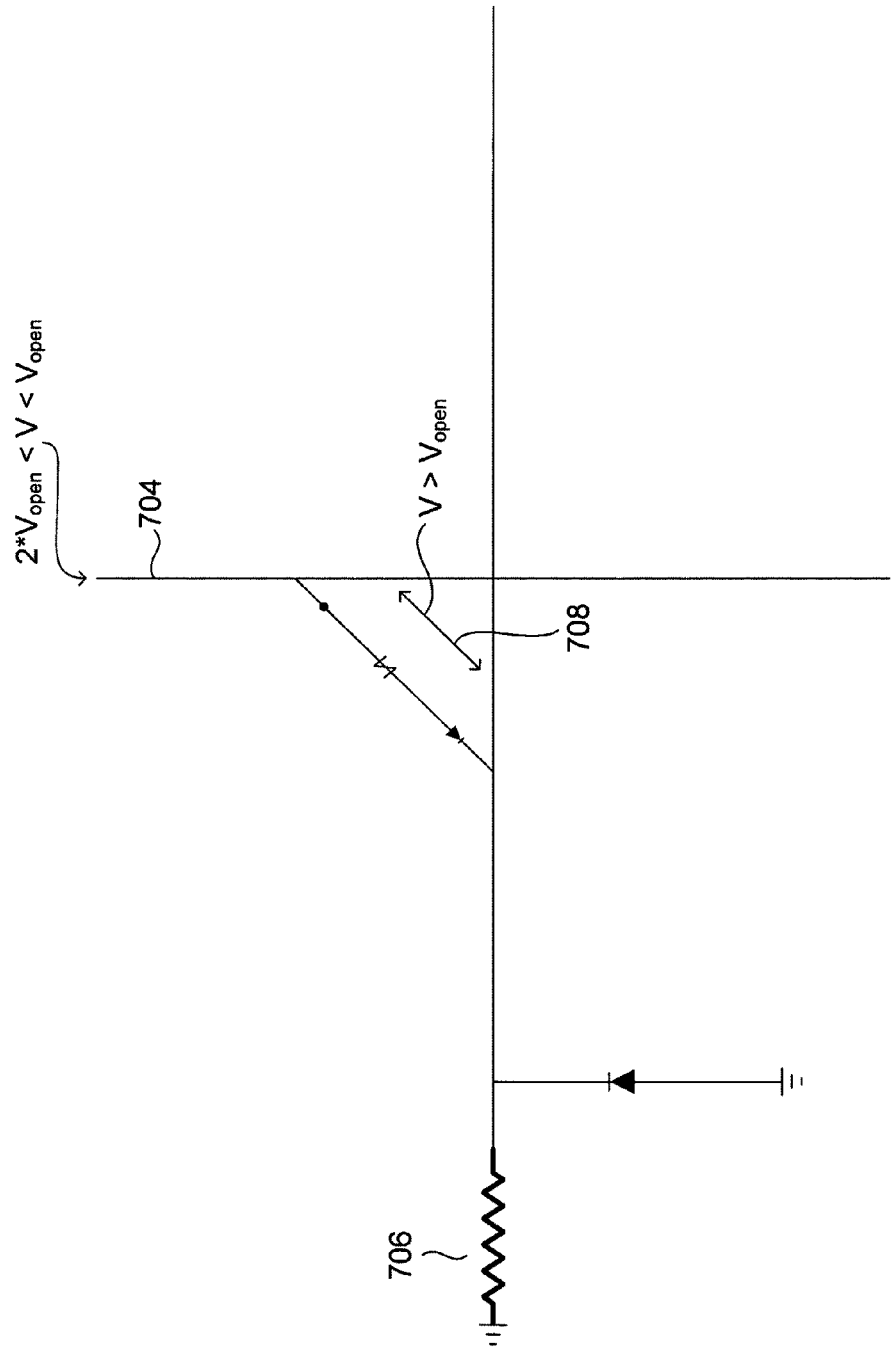
Figure 7C:
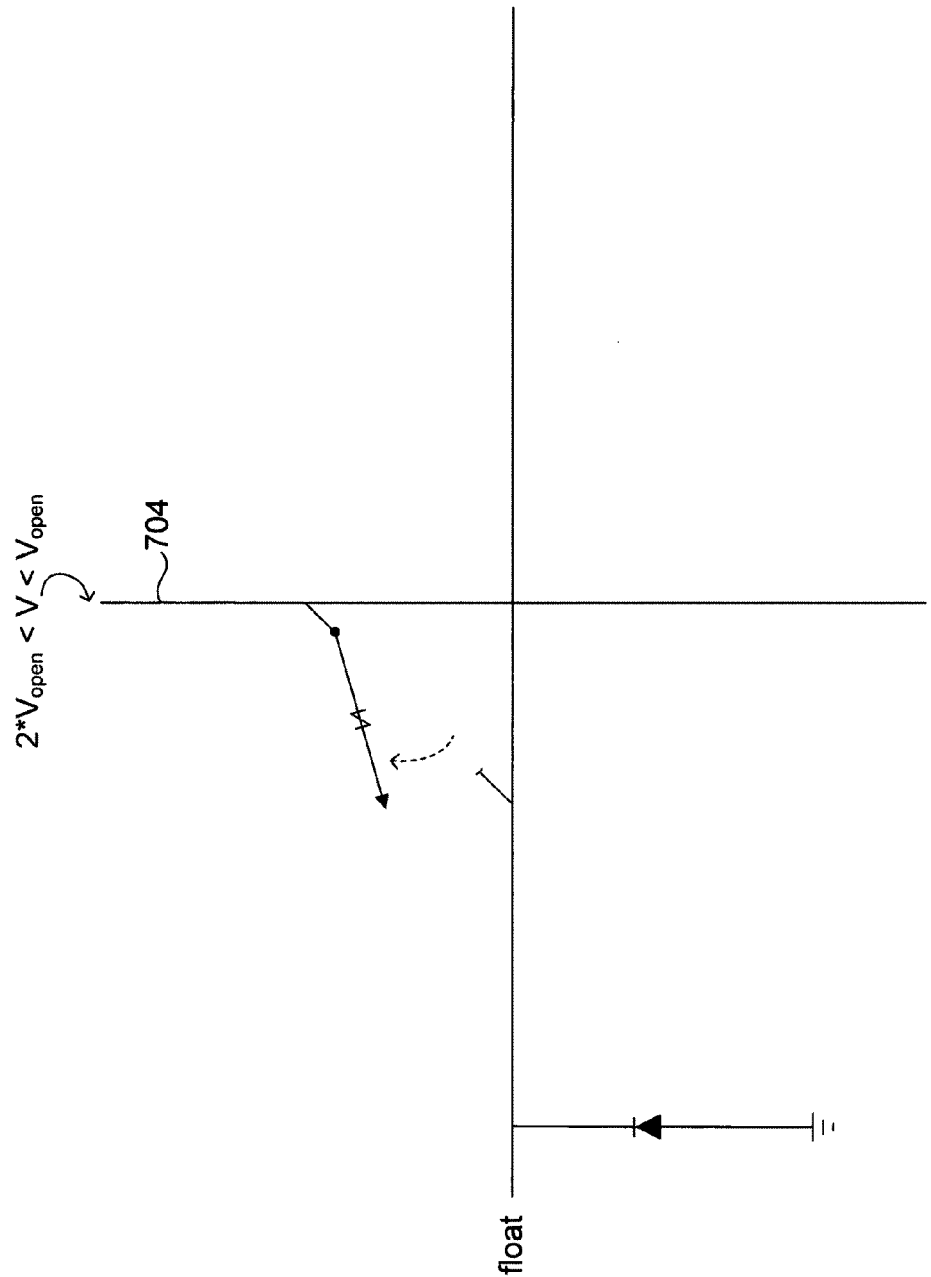

A second embodiment of a nanoscale latch uses different operational voltages and operates as a non-inverting latch. FIGS. 7A-7C illustrate operation of a non-inverting nanoscale latch. In order to prepare the non-inverting latch to receive data, the non-inverting latch is closed, by applying a voltage greater than $V_{close}$. When a low voltage, representing logical value "0," is input to the data bus through a resistor 706, and a negative write voltage V greater than $2 \times V_{open}$ but less than $V_{open}$ is applied to the vertical control line 704, the voltage dropped across the hysteretic, resistive nanowire junction 708 is greater than $V_{open}$, due to the voltage divider formed by the resistor 706 and the hysteretic, resistive nanowire junction, and the nanoscale latch remains closed. Thus, the nanoscale latch faithfully stores the logical value "0" input to the nanoscale latch. By contrast, when the logical value "1" is input to the data bus, represented by a float state on a data bus, and the write voltage is applied to the vertical control line 704, then the voltage drop across the hysteretic, resistive nanowire junction is less than $V_{open}$ and the transition from the closed to the open state (234 in FIG. 2) occurs, so that the nanoscale latch ends up storing the logical value "1" input to the data bus.

Figure 8A:
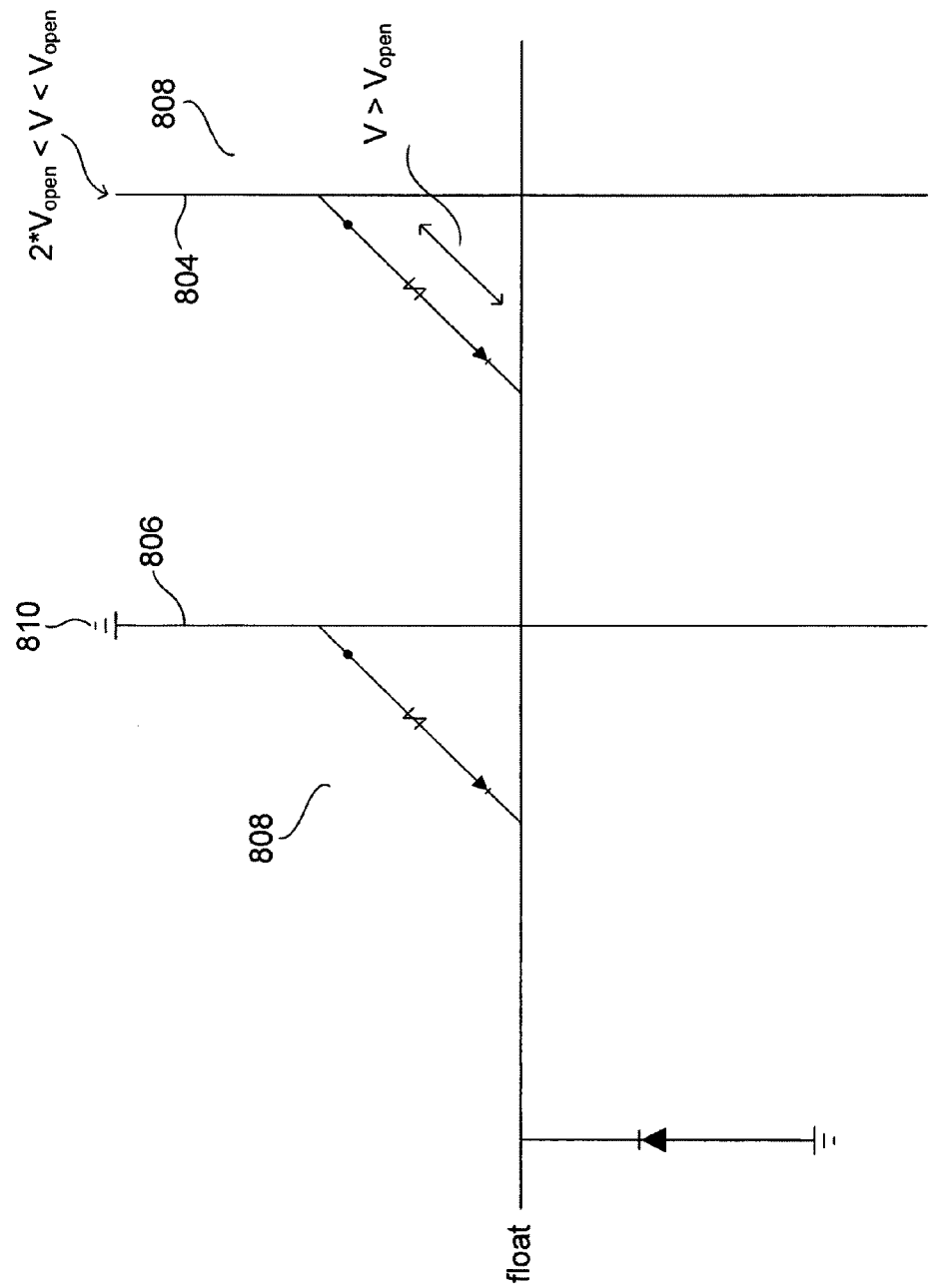
FIGS. 8A-8B illustrate transfer of data from a source nanoscale latch to a target nanoscale latch along a nanowire data bus that interconnects non-inverting latches.
Figure 8B:
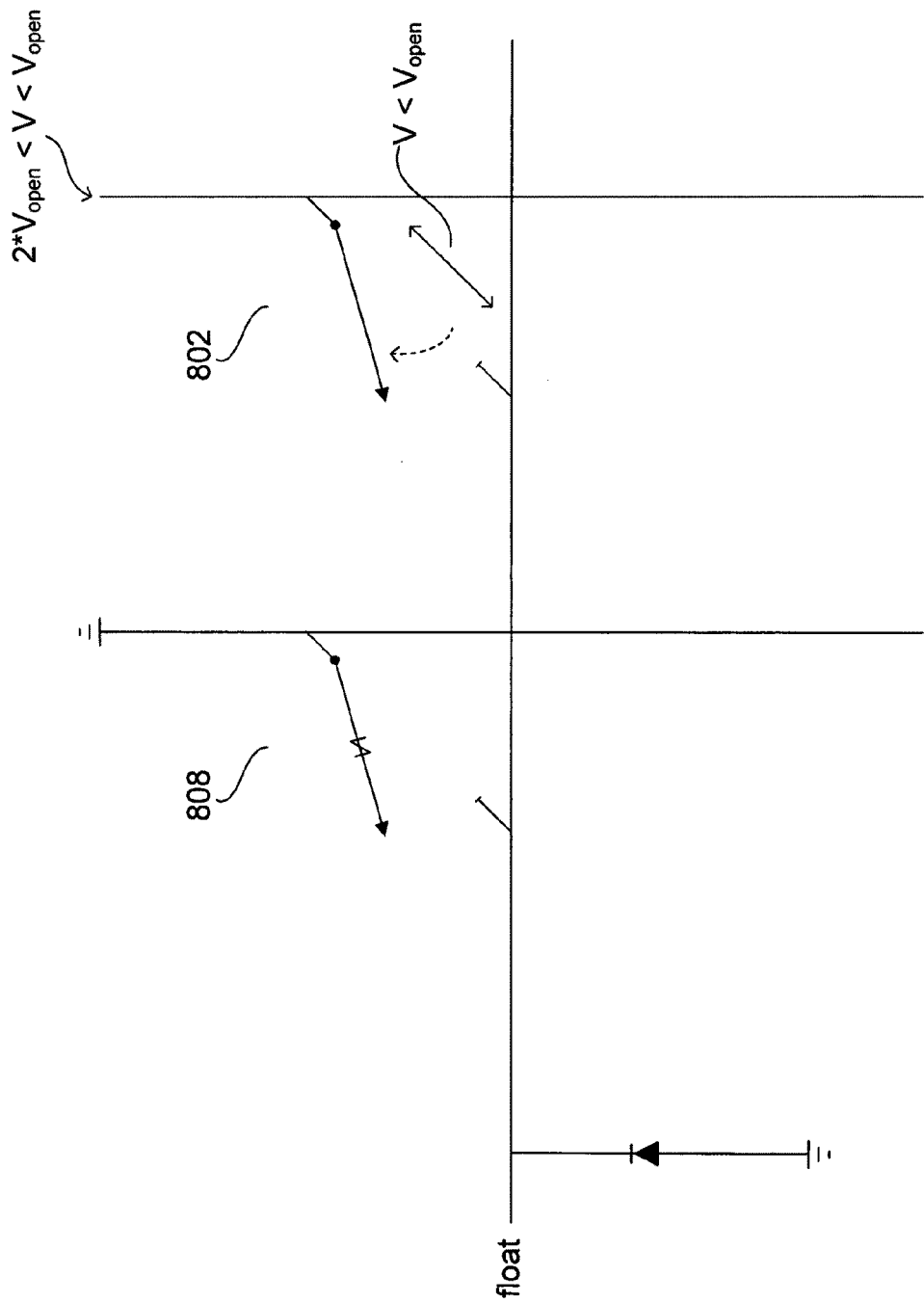

FIGS. 8A-8B illustrate transfer of data from a source nanoscale latch to a target nanoscale latch along a nanowire data bus that interconnects non-inverting latches. The target nanoscale latch 802 is placed into a closed state, as discussed above with reference to FIG. 7A. Then, the negative write voltage V greater than $2 \times V_{open}$ and less than $V_{open}$ is applied to the vertical control line 804 of the target nanoscale latch, while the vertical control line 806 of the source nanoscale latch 808 is driven to ground 810. When, as shown in FIG. 8A, the source nanoscale latch is closed, a voltage greater than $V_{open}$ is obtained across the target nanoscale latch, due to the voltage divider formed by the source and target nanoscale latches, and the target nanoscale latch remains closed. By contrast, as shown in FIG. 8B, when the source nanoscale latch 808 is in the open state, then the entire negative write voltage ends up dropped across the target nanoscale latch 802, resulting in opening of the target nanoscale latch to reflect the state of the source nanoscale latch.

Thus, both inverting and non-inverting nanoscale latches can be assembled along a data bus, and logical values can be transferred from external sources to the data bus for storage into a target nanoscale latch, a logical value stored in a source nanoscale latch can be read out to an external target on the data bus, and a logical data value can be transferred from a source nanoscale latch to a target nanoscale latch along the data bus. Nanoscale latches, latch arrays, and latch operation is further described in "Computing with hysteretic resistor crossbars," G. Snider, Appl. Phys. A 80, 1165-1172 (2005).

A Microscale/Nanoscale Shift-Register Embodiment of the Present Invention, and a Method Embodiment for Fabricating the Microscale/Nanoscale Shift Register In the previous subsection, hysteric-resistor-based nanoscale latches, and data transfer between nanoscale latches, is described to provide a basis for understanding a nanoscale shift-register embodiment of the present invention, described in the current subsection. The described nanoscale shift register employs, in addition to nanoscale latches, nanoscale field-effect transistors to control electrical interconnection of pairs of nanoscale latches, each electrical interconnection essentially constituting a data bus between the two latches, as discussed in the previous subsection. In the described nanoscale shift register, microscale latch-control and gate signal lines are employed, and thus the latches and field-effect transistors are actually mixed-scale devices. However, in either or both cases, nanowire signal lines may be employed to produce a purely nanoscale shift register. The mixed-scale nature of the described shift register is of particular use for demultiplexing signals under control of microscale components to a set of nanowires, providing an interface between microscale and sub-microscale components and nanoscale components within a mixed-scale circuit or device.

Figure 9A:
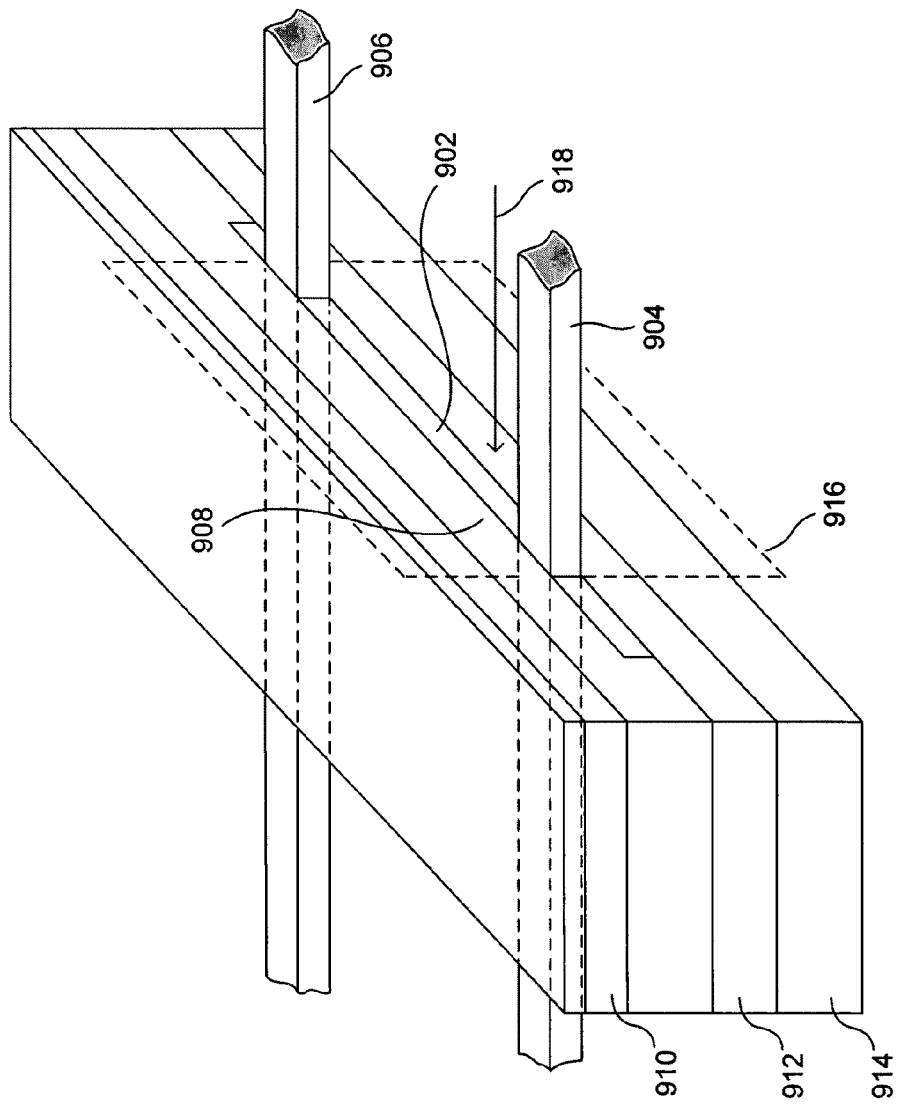
FIGS. 9A-9C illustrate one type of field-effect transistor that may be employed in a nanoscale shift-register embodiment of the present invention.
Figure 9B:
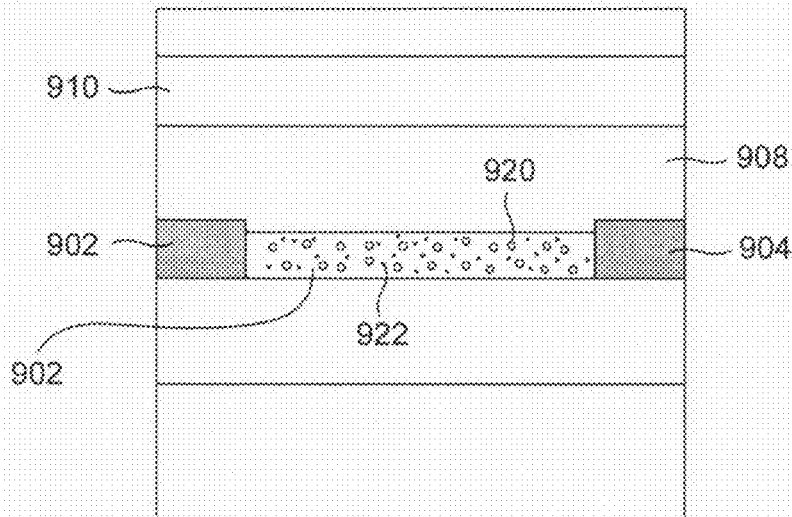
Figure 9C:
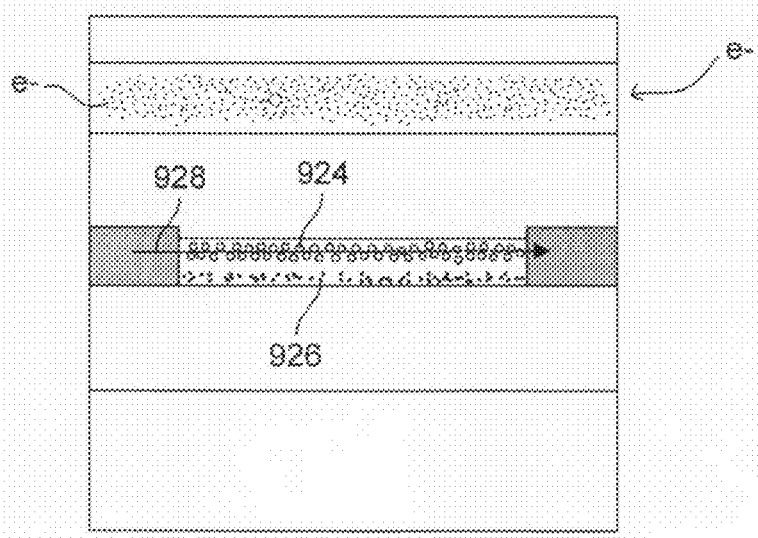

FIGS. 9A-9C illustrate one type of field-effect transistor that may be employed as a gate in a nanoscale shift register. In FIG. 9A, a perspective view of the nanoscale field-effect transistor is shown. The field-effect transistor ("FET") comprises a depletion-type semiconductor 902 layered between two conductive nanowires 904 and 906. The depletion-type semiconductor 902 and nanowires 904 and 906 together form an inner layer below an insulating, dielectric layer 908, such as silicon dioxide. A conductive microscale signal line 910 is layered above the dielectric layer 908, above which an encapsulation or sealing layer may be deposited, to shield the device from air, moisture, and other environmental hazards. The inner layer formed by the depletion-type semiconductor 902 and nanowires 904 lies above a silicon dioxide layer 912 formed above a crystalline silicon layer 914. The transistor operates as a switch, or gate, that can be controlled to electrically interconnect the two nanowires 904 and 906, in an ON state, or to electrically isolate the two nanowires from one another, in an OFF state. The dashed rectangle 916 in FIG. 9A, and perspective arrow 918, indicate a cross-sectional view of the FET that is shown in FIGS. 9B-C.

FIG. 9B shows the FET, illustrated in perspective in FIG. 9A, in cross-section. The depletion-type semiconductor 902 lies between the two nanowires 902 and 904, forming an inner layer below the insulative, dielectric layer 908 and the conductive signal line 910. FIG. 9B illustrates the FET in an OFF state, in which the two nanowires are electrically isolated from one another. Current may be carried in the semiconductor 902 by holes, under favorable conditions. However, the semiconductor is doped so that, in the absence of an electrical field, the hole carriers tend to be complexed with negatively charged entities, and are therefore relatively immobile. In FIG. 9B, the holes are indicated by unfilled circles, such as hole 920, and the negatively charged entities are indicated by dots, such as dot 922. An electrical field can be generated within the FET by application of a voltage or current to the microscale signal line 910. FIG. 9C illustrates the FET described above with respect to FIGS. 9A-B in an ON state, with the two nanowires electrically interconnected. As shown in FIG. 9C, application of a potential or current to the conductive-signal-line layer 910 produces an electrical field across the dielectric layer 908 that attracts the hole carriers within the semiconductor 902 to form an enriched, hole layer 924 proximal to the dielectric layer 908. The applied electrical field also repulses the negatively charged entities into a negatively charged, distal layer 926 within the semiconductor 902. The uncomplexed holes in the hole layer 924 have relatively high mobility, and can conduct electrical current between the two nanowires 902 and 904, indicated in FIG. 9C by arrow 928. Thus, application of a voltage or current to the conductive signal line 910 of the FET switches the FET on, and electrically interconnects the two nanowires. Absence of an applied potential or a current results in logical isolation of the two nanowires.

The above-described FET is but one example of a large number of different types of signal-controlled gates that may be employed in nanoscale-shift-register embodiments of the present invention to control interconnection of pairs of nanowires. Other types of transistors may be employed, for example. Additional types of controllable gates may also be employed, including nanoscale electromechanical gates, non-transistor-based electrical gates, and other types of gates.

FIG. 10 illustrates a nanoscale shift register that represents one embodiment of the present invention. The nanoscale shift register comprises: (1) a first microscale latch-control signal line 1002; (2) a first microscale gate signal line 1004; (3) a second microscale gate signal line 1006; (4) a second microscale latch-control signal line 1008; (5) eight nanowires 1010-1917; (6) a substrate (not shown in FIG. 10); (7) a configurably-resistive layer 1018-1019 above the two microscale latch-control signal lines 1002 and 1008 and below the nanowires 1010-1017 that serves as latch resistive elements; (8) an insulating, dielectric layer 1020 above the two microscale gate signal lines 1004 and 1006 and below the ten nanowires 1010-1019; and (9) eight FETs 1022-1029 that each controls electrical connection between a pair of nanowires. The nanoscale shift register shown in FIG. 10, representing one embodiment of the present invention, features a nanoscale latch at each point of closest contact between a nanowire and a latch-control signal line. Thus, the nanoscale shift register of FIG. 10 includes four nanoscale latches 1030-1033 at the points of closest contact between nanowires 1010, 1012, 1014, and 1016 and microscale latch-control signal line 1002, and, similarly, four nanoscale latches 1034-1037 along microscale latch-control signal line 1008. In this document, the phrase "internal nanowire" refers to those nanowires that are interconnected through two different gates to a preceding nanowire and a next nanowire. For example, nanowires 1011-1016 are all internal nanowires. Nanowire 1010, by contrast, is not an internal nanowire, because nanowire 1010 is connected only to one other nanowire, nanowire 1011, through a single gate 1022. If there are additional nanowires in the device not shown in FIG. 10, then nanowire 1017 may be an internal nanowire, but, as shown in FIG. 10, nanowire 1017 is not an internal nanowire, since it, like nanowire 1010, is connected only to one other nanowire.

The nanoscale shift register operates as follows. First, all of the nanoscale latches are placed in an open position. Next, a single bit of data is input on the data input line 1010 to a first nanoscale latch 1030. This completes initialization of a signal demultiplexing operation in which the data input to the first nanoscale latch 1030 is successively output to each of the remaining nanowire signal lines 1011-1017. In the next step, a voltage or current signal is applied to the first microscale gate signal line 1004 in order to place FETs 1022, 1024, 1026, and 1028 into ON states, electrically interconnecting nanowires 1010 and 1011, 1012 and 1013, 1014 and 1015, and 1016 and 1017. Then, signals are applied to the two latch-control signal lines in order to copy the data stored in nanoscale latch 1030 to nanoscale latch 1034 with concurrent output of the data to nanowire 1011. Next, the signal applied to the first microscale gate signal line 1004 is discontinued, and a voltage or current signal is applied to the second microscale gate signal line 1006, thereby placing each of FETs 1023, 1025, 1027, and 1029 in ON states and placing FETs 1022, 1024, 1026, and 1028 in OFF states. Thus, at this point, logical interconnection is established between the pairs of nanowires 1011 and 1012, 1013 and 1014, 1015 and 1016, and any additional such pairs not shown in FIG. 10. Then, signals are applied to the microscale latch-control signal lines to copy the data stored in latch 1034 to latch 1031, with concurrent output of the data to nanowire 1012. This alternating process continues to successively store the originally input data into nanoscale latches 1035, 1032, 1036, 1033, 1037, and any additional latches not shown in FIG. 10, and to successively output the data to nanowire signal lines 1013, 1014. 1015, 1016, and 1017. Once the input data has been distributed to each of the nanowires, by the alternating data control and latch control process described above, the latches can be reinitialized, and a new data bit received into the first nanoscale latch 1030, to start the process all over again.

A more detailed description of operation of the described nanoscale shift register is provided in the next subsection. It should be noted that the exact timings of the gate and latch-control signals depend on the size and spacings of the nanoscale shift-register components, on the material composition of the components, and on other features and characteristics of the nanoscale shift register. Moreover, the number, timing, and magnitudes of the signals input to the microscale latch-control signal lines depend on the type of latches employed in the nanoscale signal line. An arbitrary number of nanowire signal lines can be incorporated into a nanoscale shift register of the present invention, with corresponding FET gates for controlling interconnections between the arbitrary number of nanowires. Finally, alternative embodiments may possibly employ sub-microscale or nanoscale latch-control lines and/or gate signal lines.

Figure 11B:
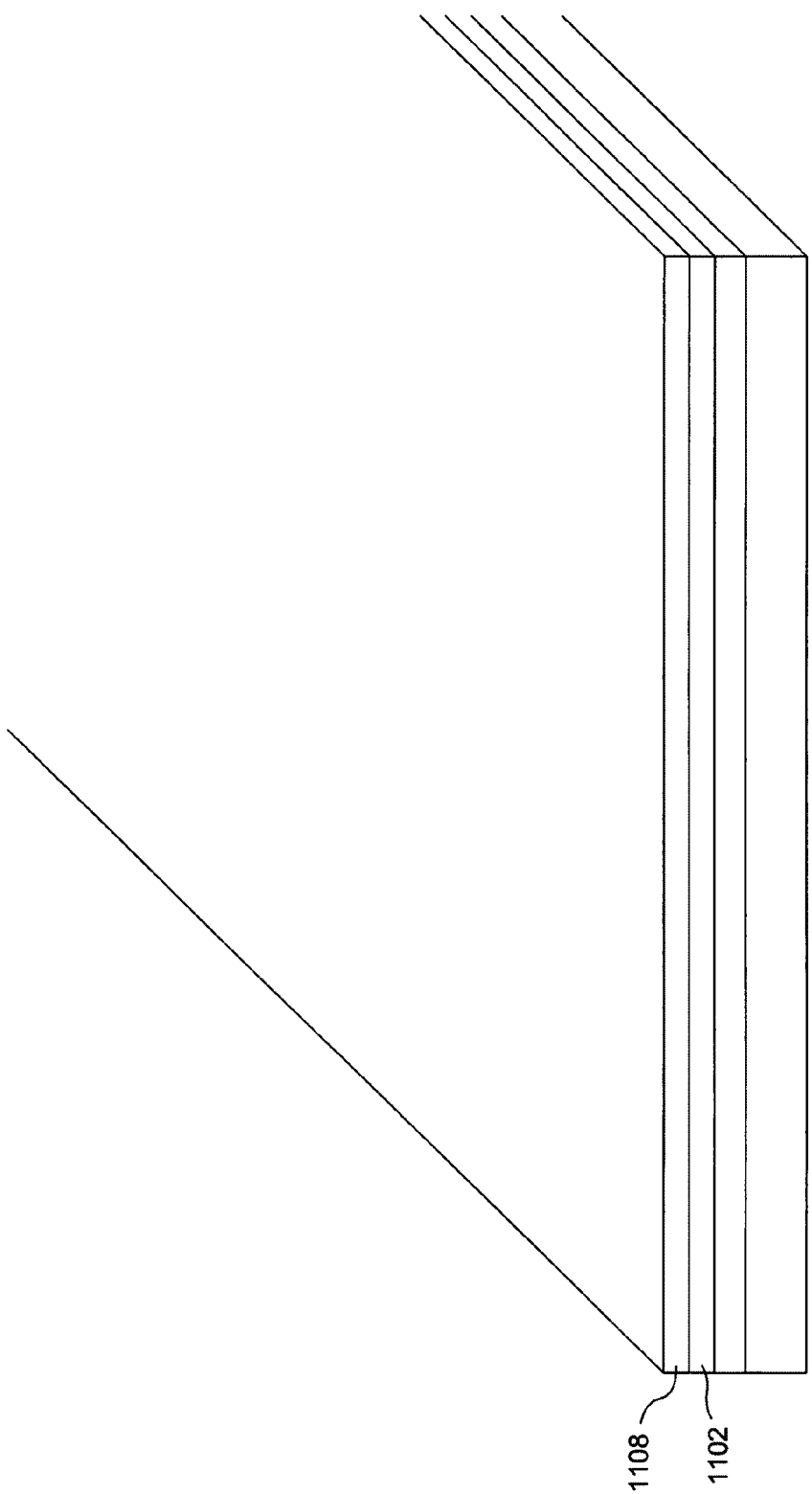
FIGS. 11A-11N illustrate one method for fabricating the above-described nanoscale shift register.
Figure 11C:
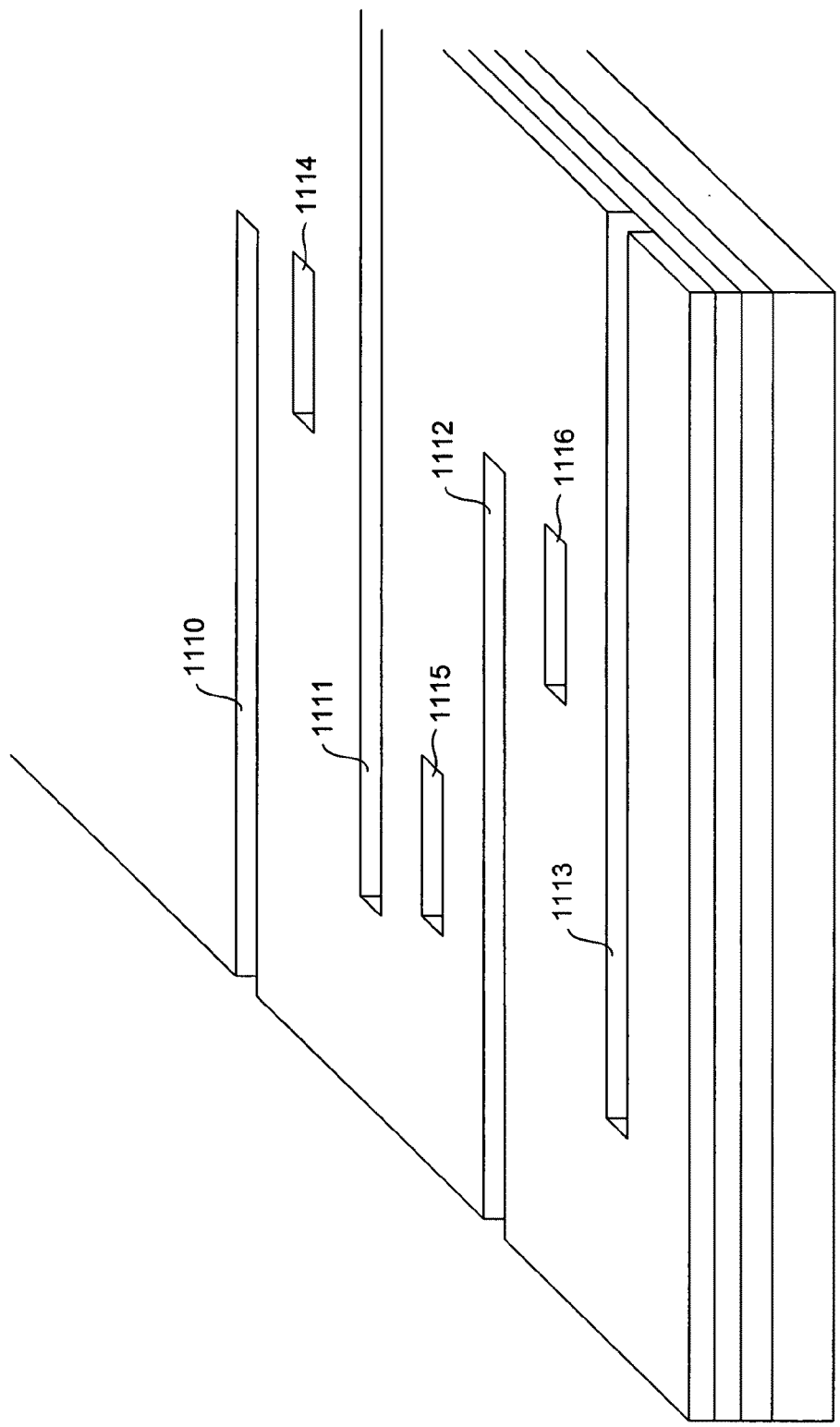
Figure 11D:
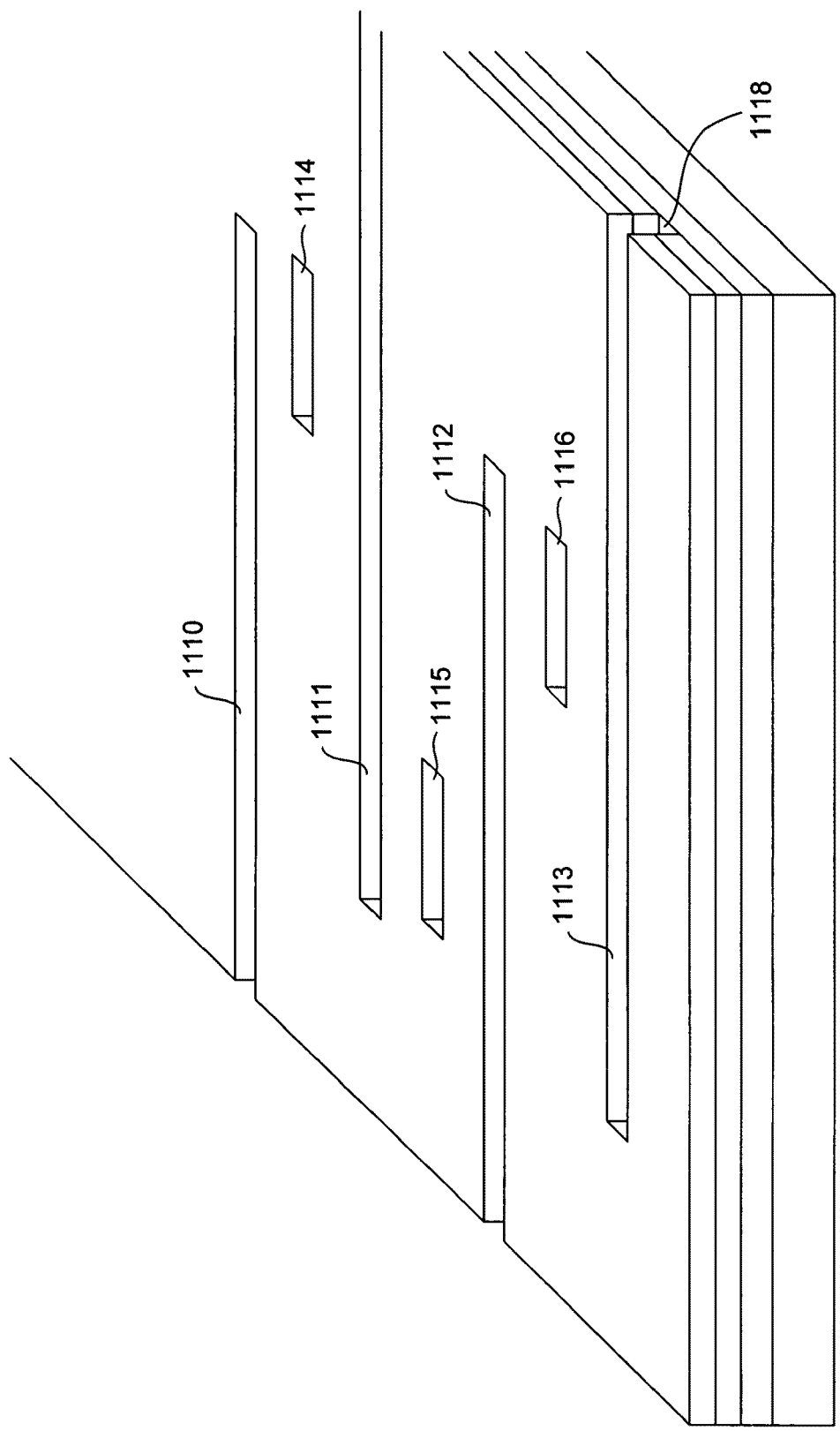
Figure 11E:
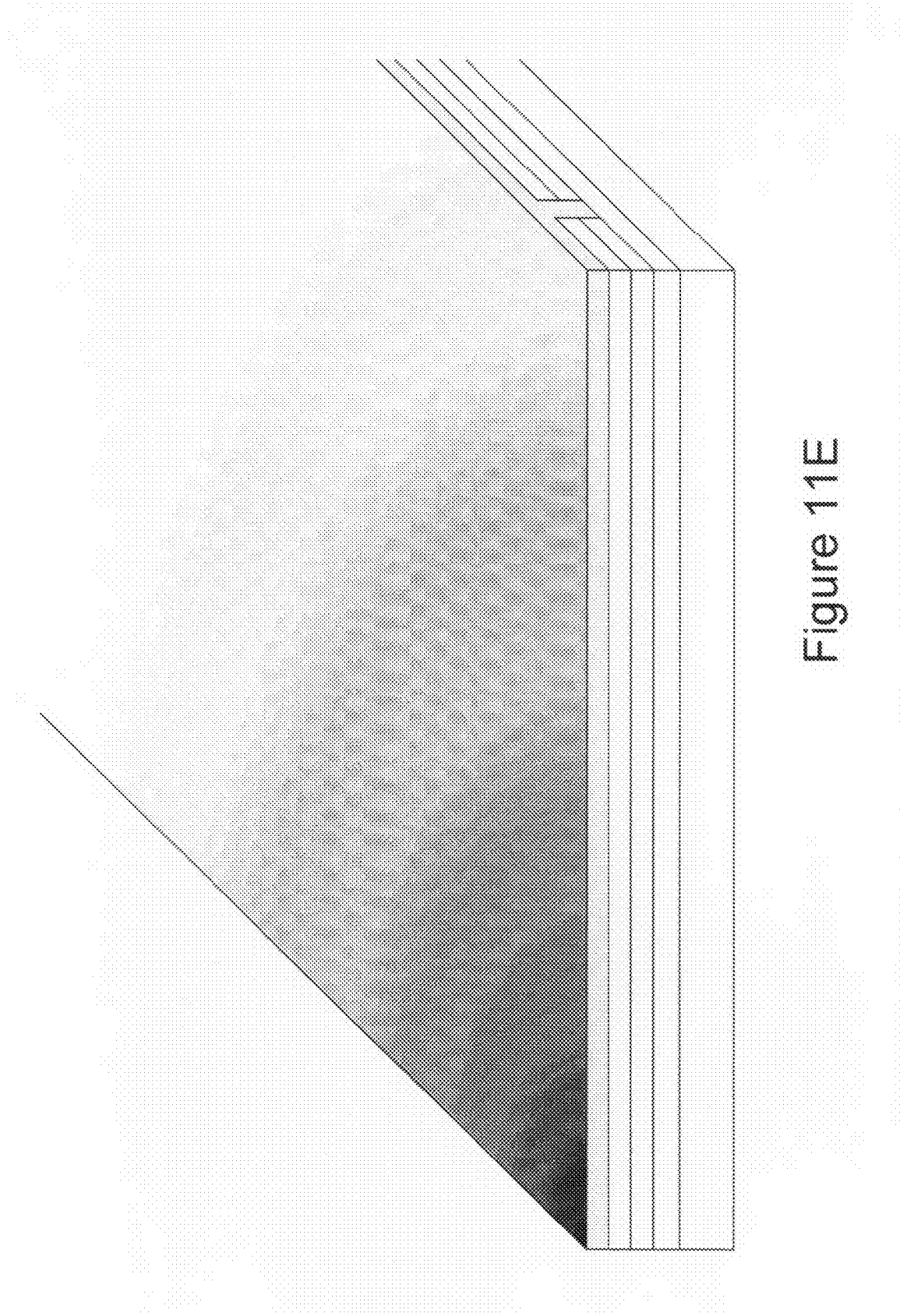
Figure 11F:
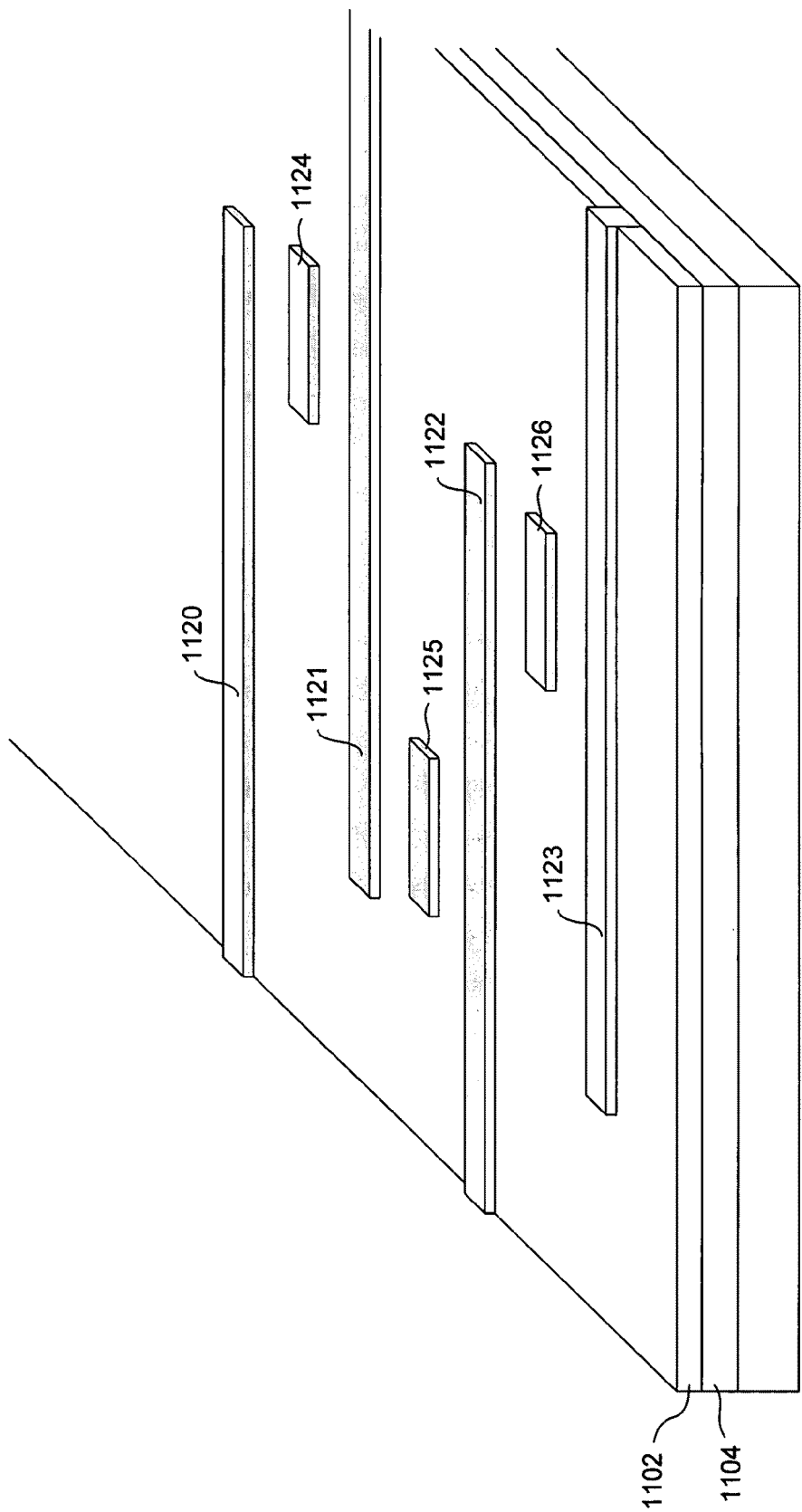
Figure 11G:
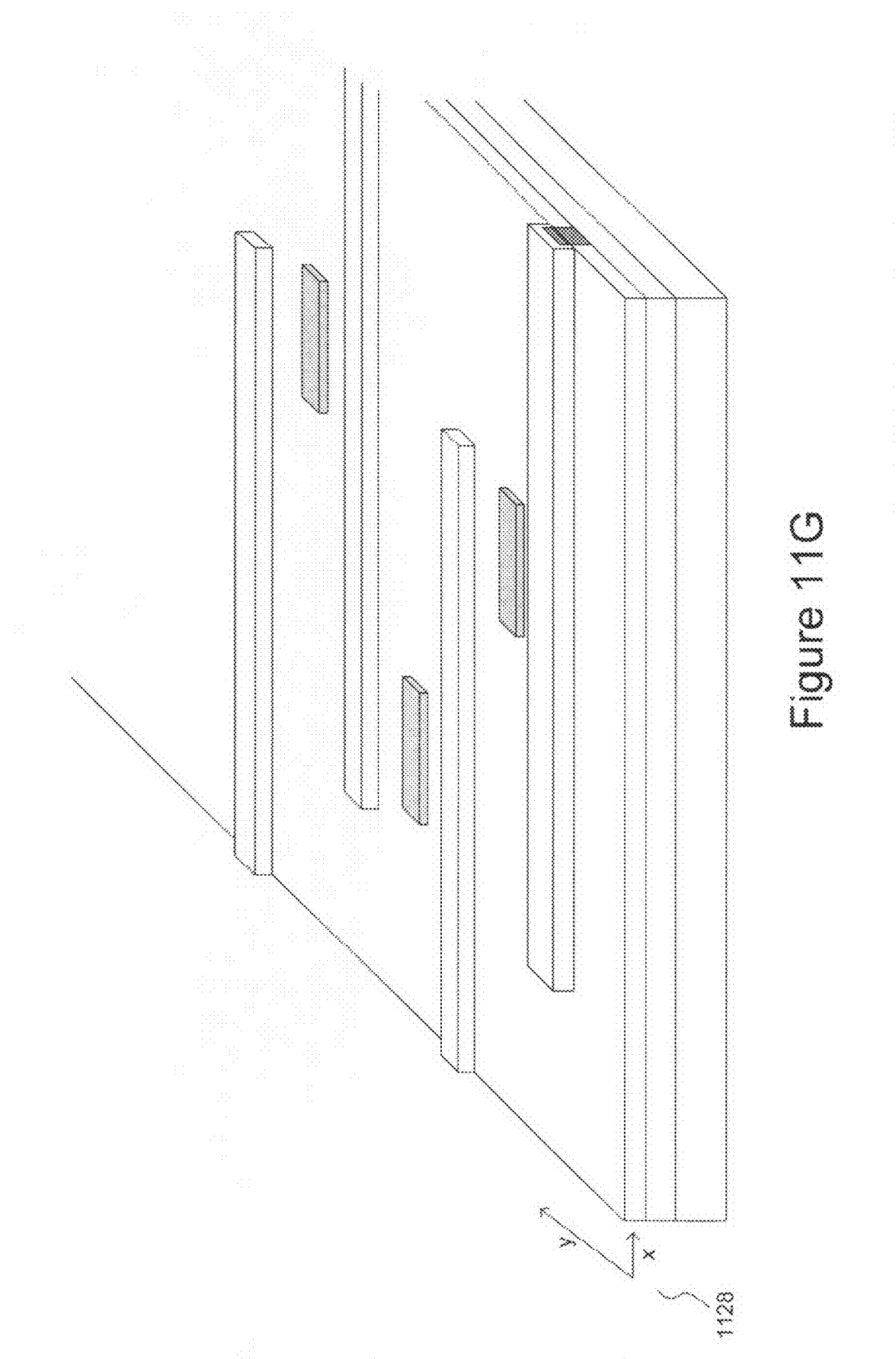
Figure 11H:
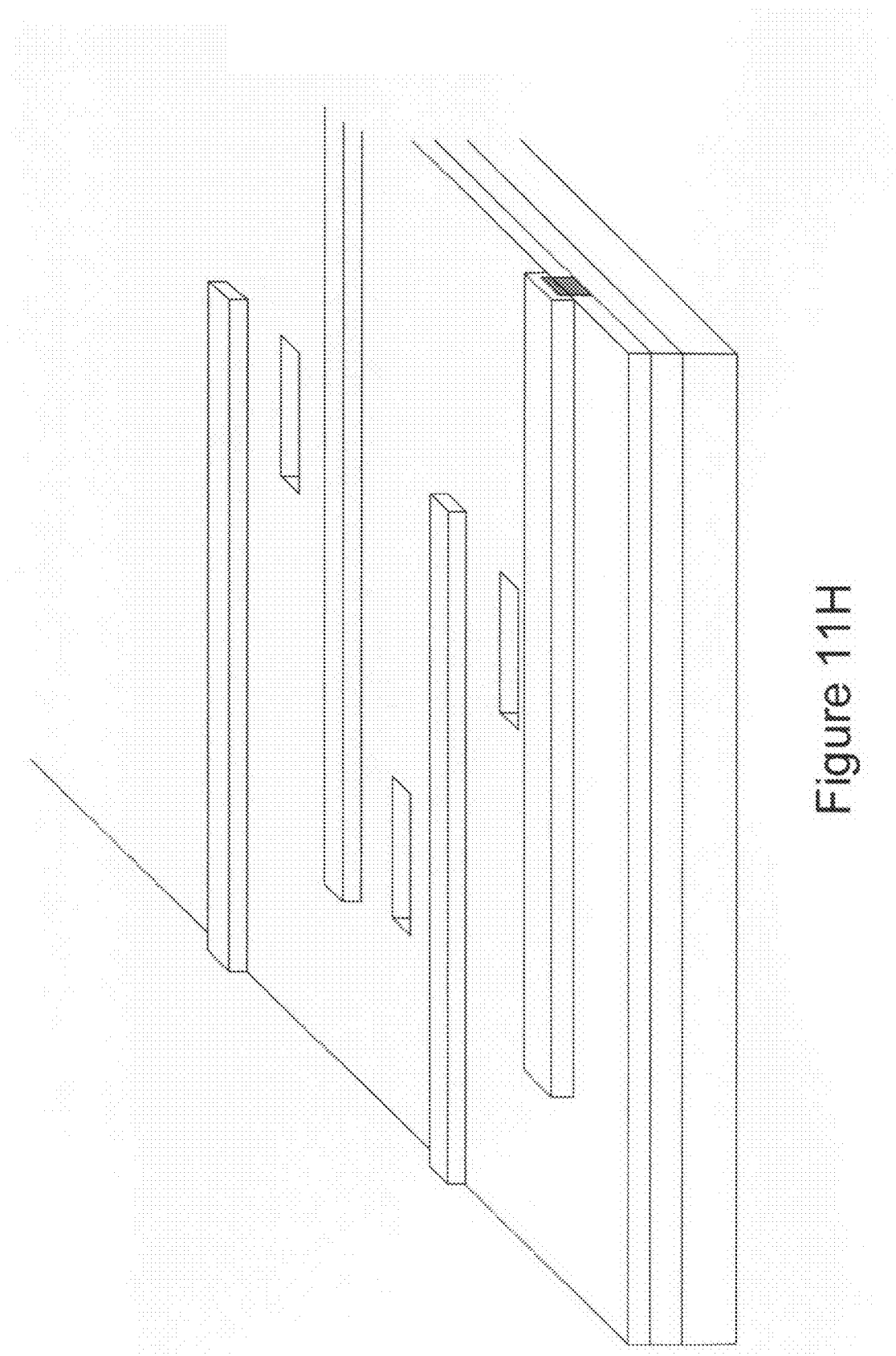
Figure 11L:
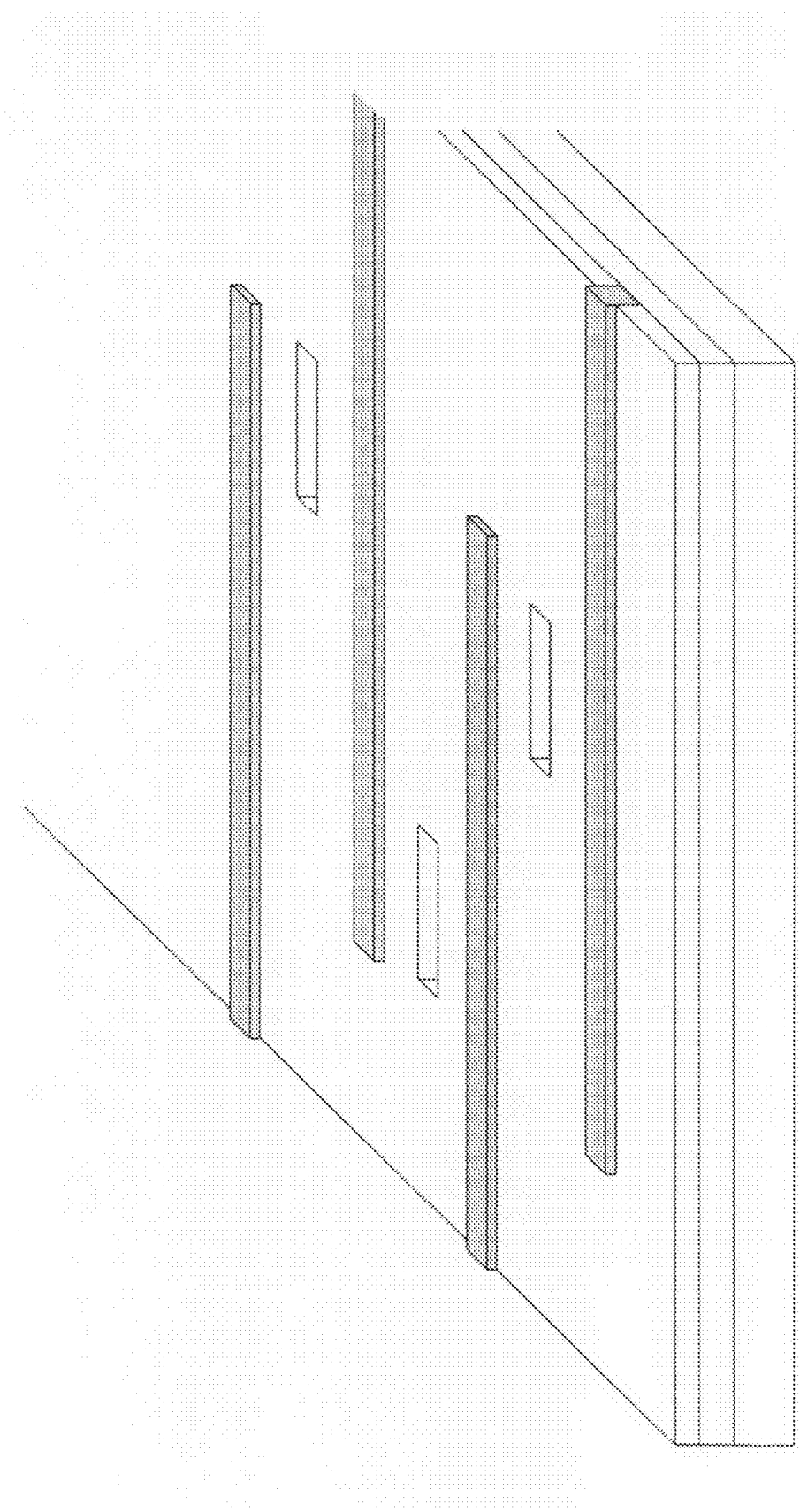
Figure 11J:
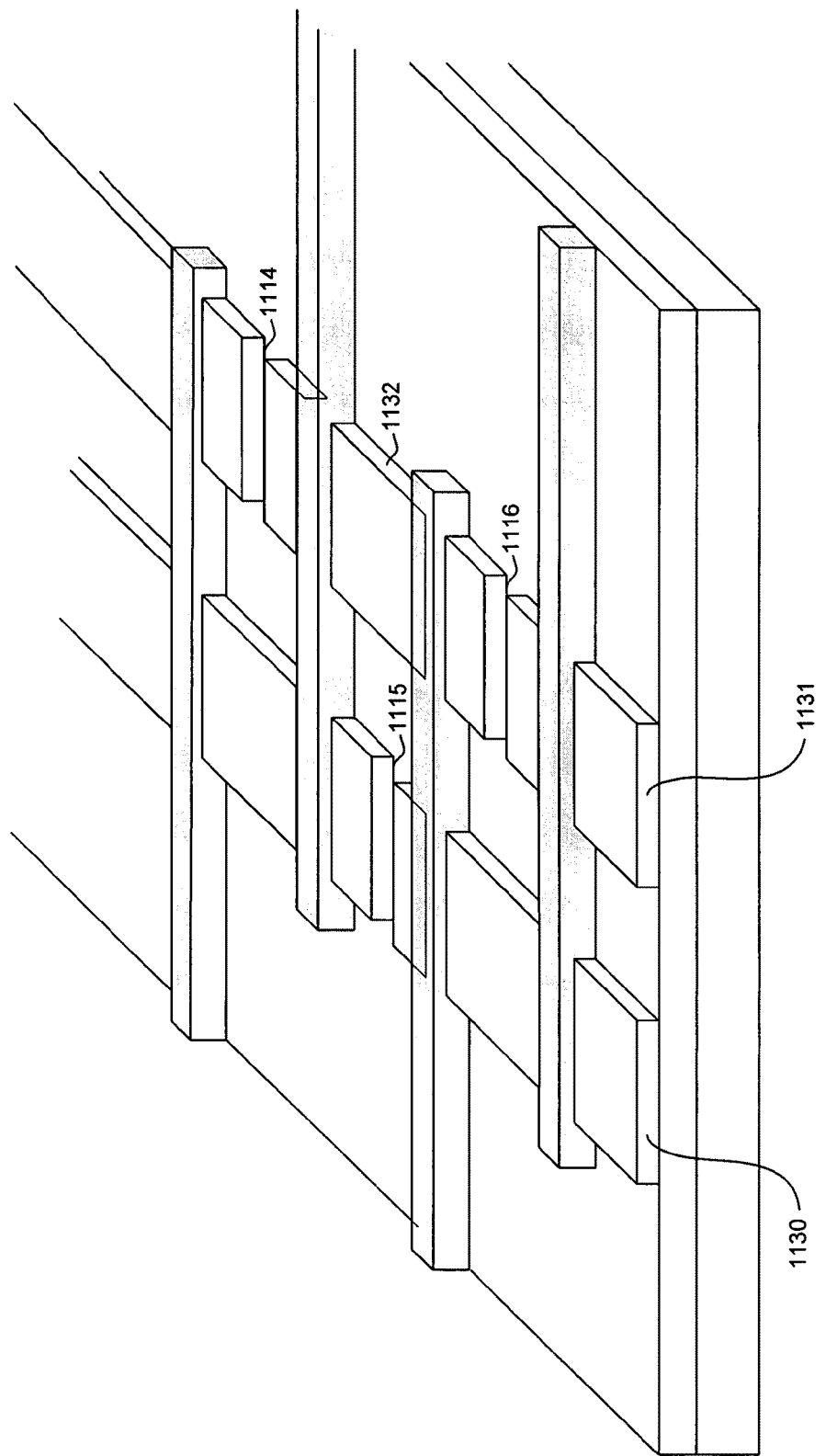
Figure 11K:
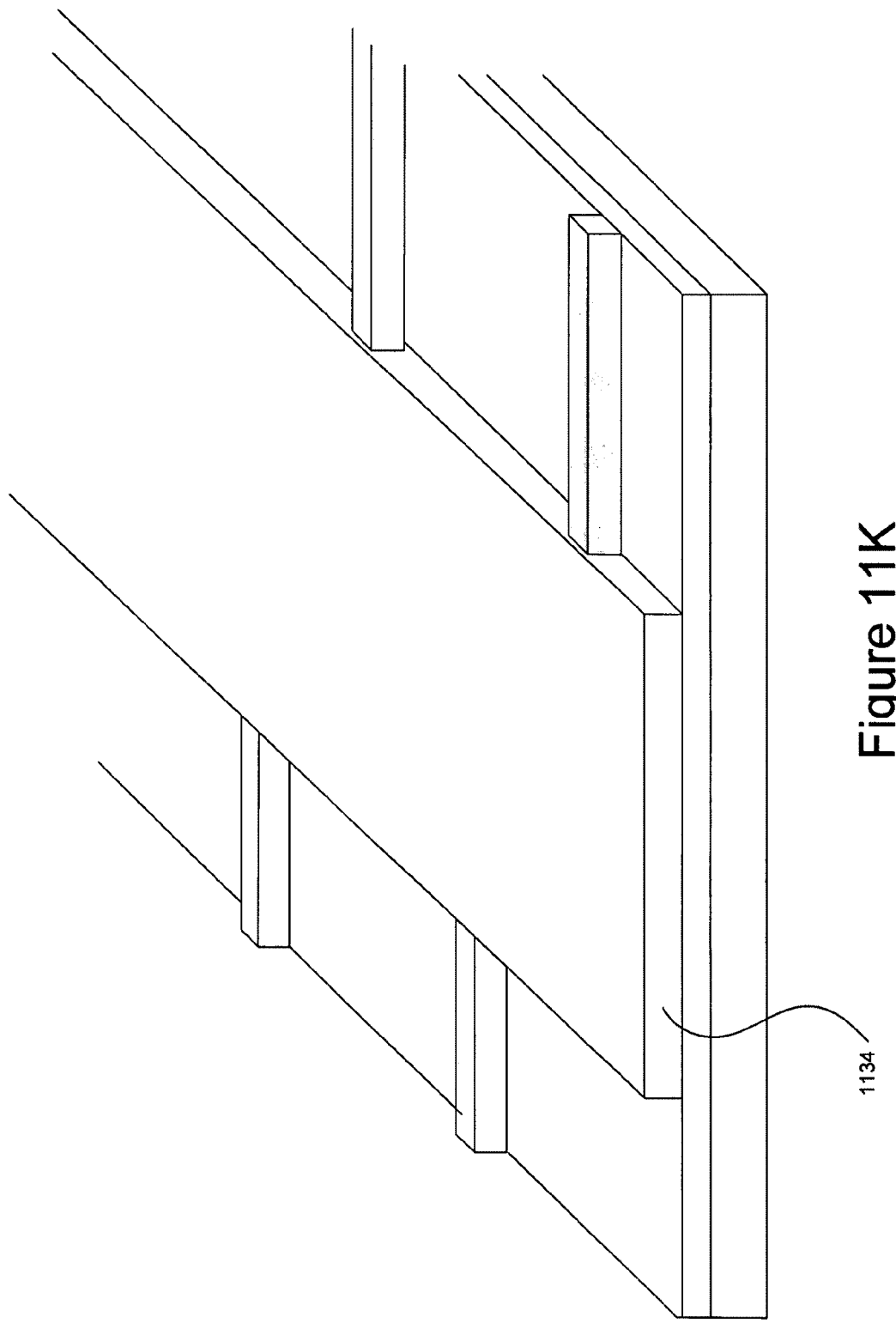
Figure 11M:
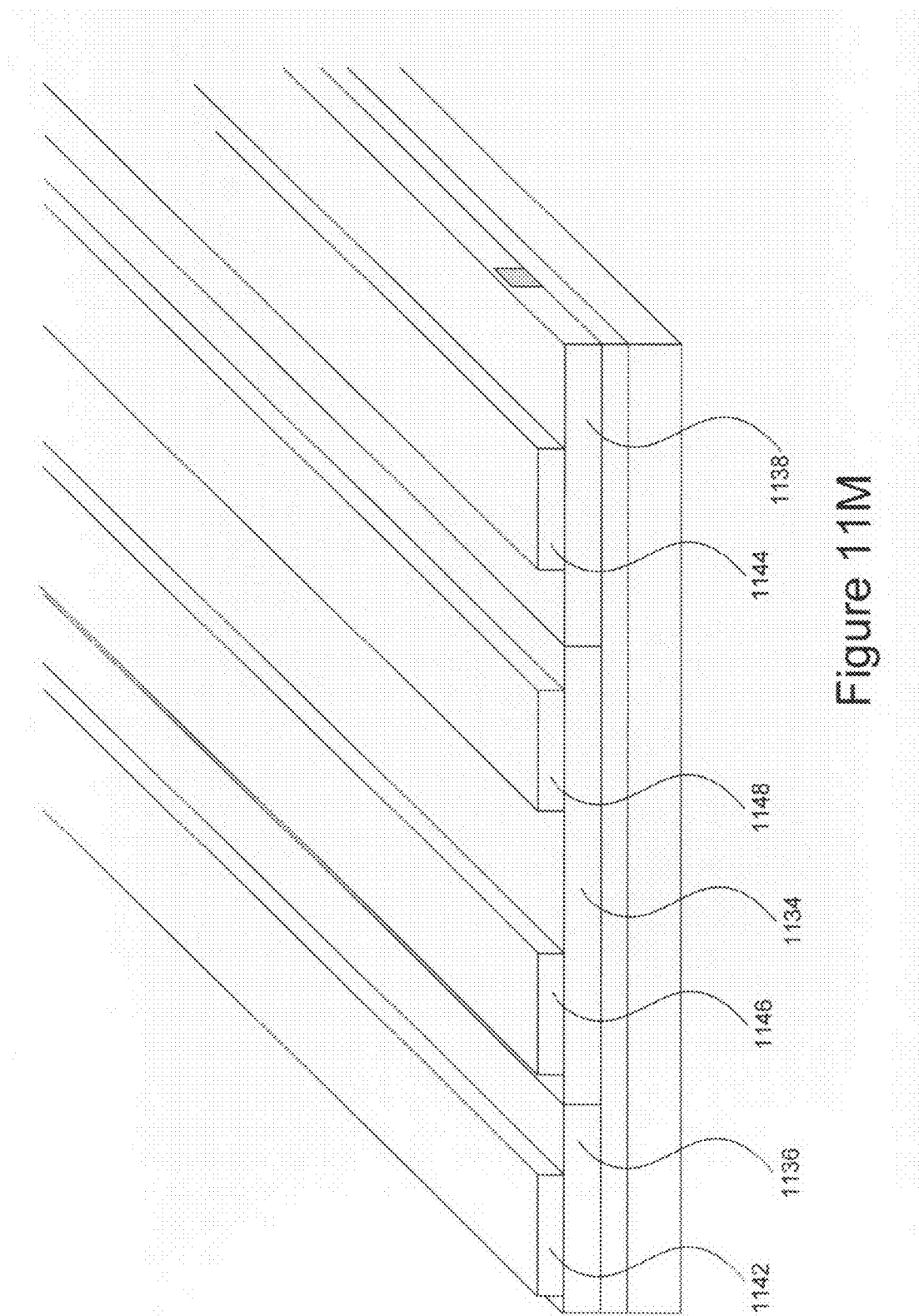
Figure 11N:
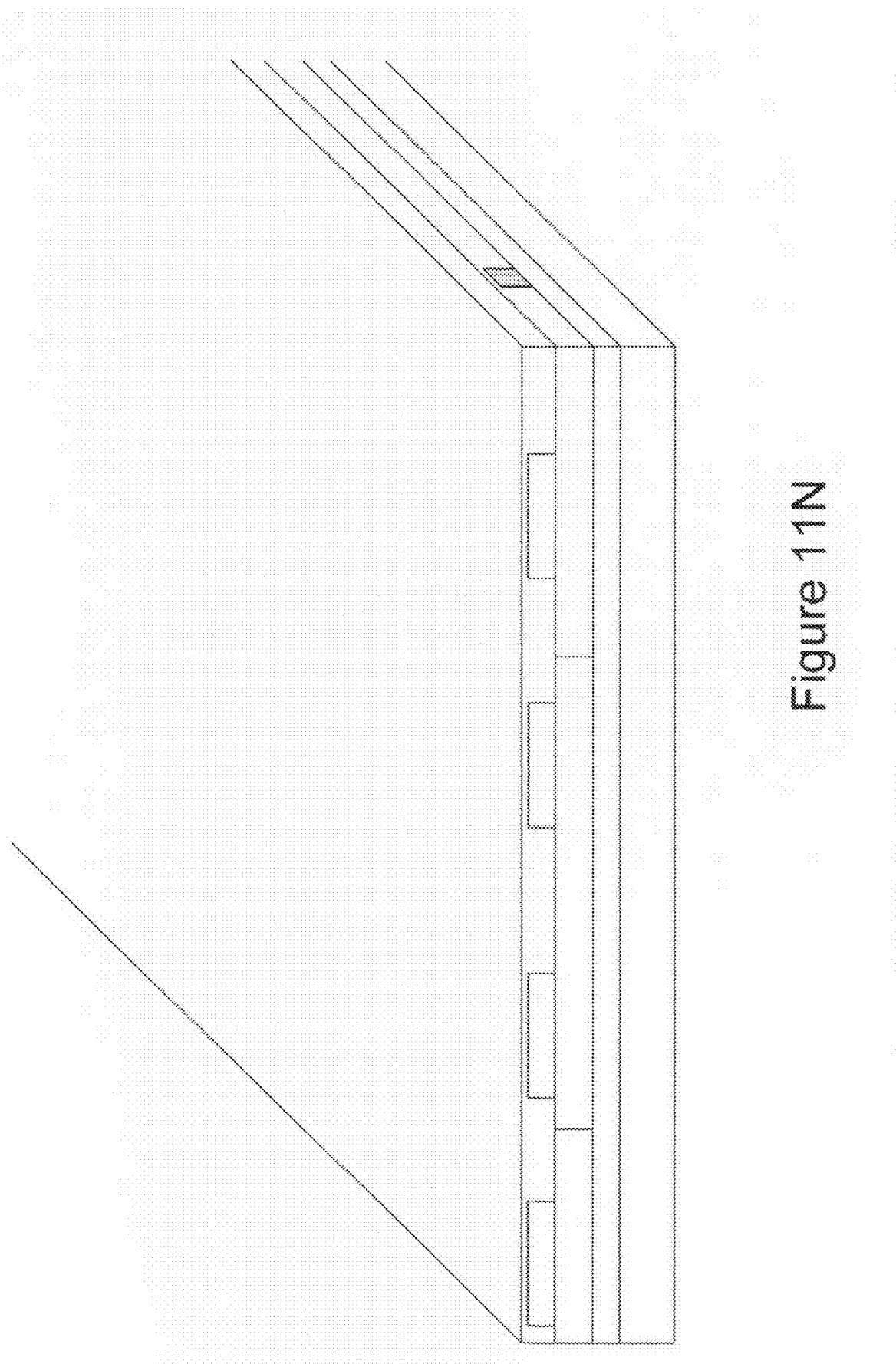

FIGS. 11A-11N illustrate one method for fabricating the above-described nanoscale shift register. The process begins, as shown in FIG. 11A, with a silicon-on-insulator ("SOI") surface 1102 comprising a relatively thin crystalline silicon layer 1102 above a silicon dioxide layer 1104 formed above a thicker, crystalline-silicon substrate 1106. The relatively thin crystalline silicon layer 1102 is assumed to have been properly doped to produce a suitable, depletion-type semiconductor for use as the source/drain element of the FET transistors that control electrical connection between a pair of nanowires in the nanoscale shift register. In a first step, shown in FIG. 11B, a nanoimprinting-resist layer 1108 is applied to form a layer above the relatively thin crystalline silicon layer 1102. Once the nanoimprinting-resist layer has been deposited, the nanoimprinting-resist layer is imprinted, using nanoscale imprint stamping, as shown in FIG. 11C. Nanoscale imprinting produces a series of relatively long troughs 1110-1113, or channels, and shorter trough-segments 1114-1116 in a specific pattern within the nanoimprinting-resist layer. Next, as shown in FIG. 11D, an etching technique is employed to etch the relatively thin silicon layer 1102 exposed at the bottom of the troughs and trough segments down to the underlying silicon dioxide layer. This is best seen at the end 1118 of trough 1113 in FIG. 11 D. Neither the nanoimprinting-resist nor those portions of the silicon layer 1102 underlying the nanoimprinting-resist are removed by the etching technique. Then, as shown in FIG. 11E, a conductive material is applied by a vapor-deposition technique onto the nanoimprinting-resist layer and into the nanoimprinted troughs. The resulting structure is etched or planarized to produce nanowires 1120-1123 embedded within the nanoimprinting-resist layer, as well as short, nanowire segments 1124-1126, as shown in FIG. 11F. In one alternative embodiment, the excess, applied conductive material and nanoimprinting-resist layer are removed by a lift-off process. In FIG. 11F, the nanowires are shown protruding slightly above the surface of the silicon layer 1102, and extend through the silicon layer to the underlying silicon dioxide layer 1104.

Next, the nanowires 1120-1123, but not the nanowire segments 1124-1126, are connected to a voltage source by any of a number of different methods. In one method, microscale signal lines are fabricated above and orthogonal to the nanowires at reasonable, microscale distances from the rows of nanowire segments, in the y direction (the x and y directions are indicated by legend 1128), and voltages are applied to the microscale signal lines. The nanowires and nanowire segments are exposed to an electroplating solution, while a voltage is applied to the nanowires, but not the nanowire segments, resulting in electroplating of the nanowires, but not of the nanowire segments, as shown in FIG. 11G. The nanowires are, in one embodiment of the present invention, electroplated with a conductive polymer that forms a shell, or coating, on the exposed surfaces of the nanowires. The electroplated coating is resistant to a metal etching technique that is next applied to remove the nanowire segments, as shown in FIG. 11H. Then, in a subsequent etching step, the electroplated coating is removed from the nanowires, as shown in FIG. 11I. The microscale signal lines used to apply voltage for electroplating may also be removed, at this point.

In a next series of steps, the result of which are shown in FIG. 11J, a photolithographic, mask-based process is used to etch all but two columns 1130 and 1131, oriented in the y direction, of the thin layer of silicon (1102 in FIG. 11A). The columns are broken by the trough segments 114-1116 from which the nanowire segments are removed in a preceding metal etching step, discussed with reference to FIG. 11H. This results in formation of rectangular, electrically isolated, depleted silicon FET transistor source/drain elements between adjacent nanowires, such as the FET transistor source/drain element 1132.

Next, as shown in FIG. 11K, a dielectric layer 1134 is formed by photolithographic, mask-based methods to overlie the FET elements. Then, as shown in FIG. 11L, configurably-resistive layers 1136 and 1138 are laid down, and planarized, to form, together with the dielectric layer 1134, a continuous layer above the silicon dioxide layer, in which the nanowires and FET source/drain elements are embedded. Then, as shown in FIG. 11M, two latch-control microscale signal lines 1142 and 1144 and two microscale gate signal lines 1146 and 1148 are fabricated above the configurably-resistive layers 1136 and 1138 and dielectric layer 1134 to form the nanoscale shift register. As shown in FIG. 11N, a protective coating or sealing layer may be then added to protect the nanoscale shift register from exposure to air, moistures, UV light, and other such environmental hazards.

The above-described process may be incorporated into larger, nanoscale and mixed-scale device fabrication processes to fabricate nanoscale shift registers as parts of more complex circuits and devices. In such cases, many nanoscale shift registers can be concurrently fabricated in numerous rows and columns, along with additional types of component and features, including nanowire crossbars and signal lines.

Although the electroplating step is used, in the above-described process, to partition the imprinted troughs and trough segments into two different partitions that, through subsequent steps, generate two different types of features, the electroplating step can be more generally applied to partition nanoscale imprinted features, such as conductive nanoscale signal lines, into differently processed feature sets. For example, by organizing the imprinted nanoscale features into three different groups, to two of which voltage can be separately applied, and by using two different electroplated coatings, it is possible to create three different types of features in subsequent processing steps.

The above-described process was used to fabricate the nanoscale shift register shown in FIG. 10, with long, straight nanowires and columns of FET switches, but similar processes can be used to create an almost limitless number of different nanoscale shift registers, and other devices, with different geometries, different dimensions, different chemical compositions, and with other differing characteristics and parameters.

Operation of the Above-Described Microscale/Nanoscale Shift Resister, Representing One Embodiment of the Present Invention, to Distribute an Input Signal to Each of a Number of Nanowires In the previous subsection, the implementation of, fabrication of, and operation of a nanoscale shift register that represents one embodiment of the present invention is described. In the current subsection, a more detailed description of operation of a nanoscale shift-register embodiment of the present invention is provided.

FIGS. 12A-12J illustrate operation of a described nanoscale shift-register embodiment of the present invention. FIGS. 12A-12J all use the same illustration conventions, next described with respect to FIG. 12A. The nanoscale shift register includes a first latch-control signal line 1202 and a second latch-control signal line 1204, each latch-control signal line controlling a series of latches. Latch-control signal line 1202 controls latches 1206-1209, and latch-control signal line 1204 controls latches 1210-1213. The nanoscale shift register includes a first gate signal line 1216 and a second gate signal line 1218. Each gate signal line controls a series of gates. Gate signal line 1215 controls gates 1220-1223, and gate signal line 1218 controls gates 1224-1226. The nanoscale shift register includes an input signal line 1230 and seven output signal lines 1232-1238. In the following diagrams, non-inverting latches are assumed, but a nanoscale shift register employing inverting latches is straightforwardly implemented, with both types of nanoscale shift registers similarly controlled to distribute an input signal. Inverters may be fabricated, for example, on one set of latches or output signal lines in order to invert inverted data back to a non-inverted value in a nanoscale shift register that employs inverting latches. Alternatively, the circuit may be constructed with the assumption that alternative signal lines received inverted values.

Figure 12A:
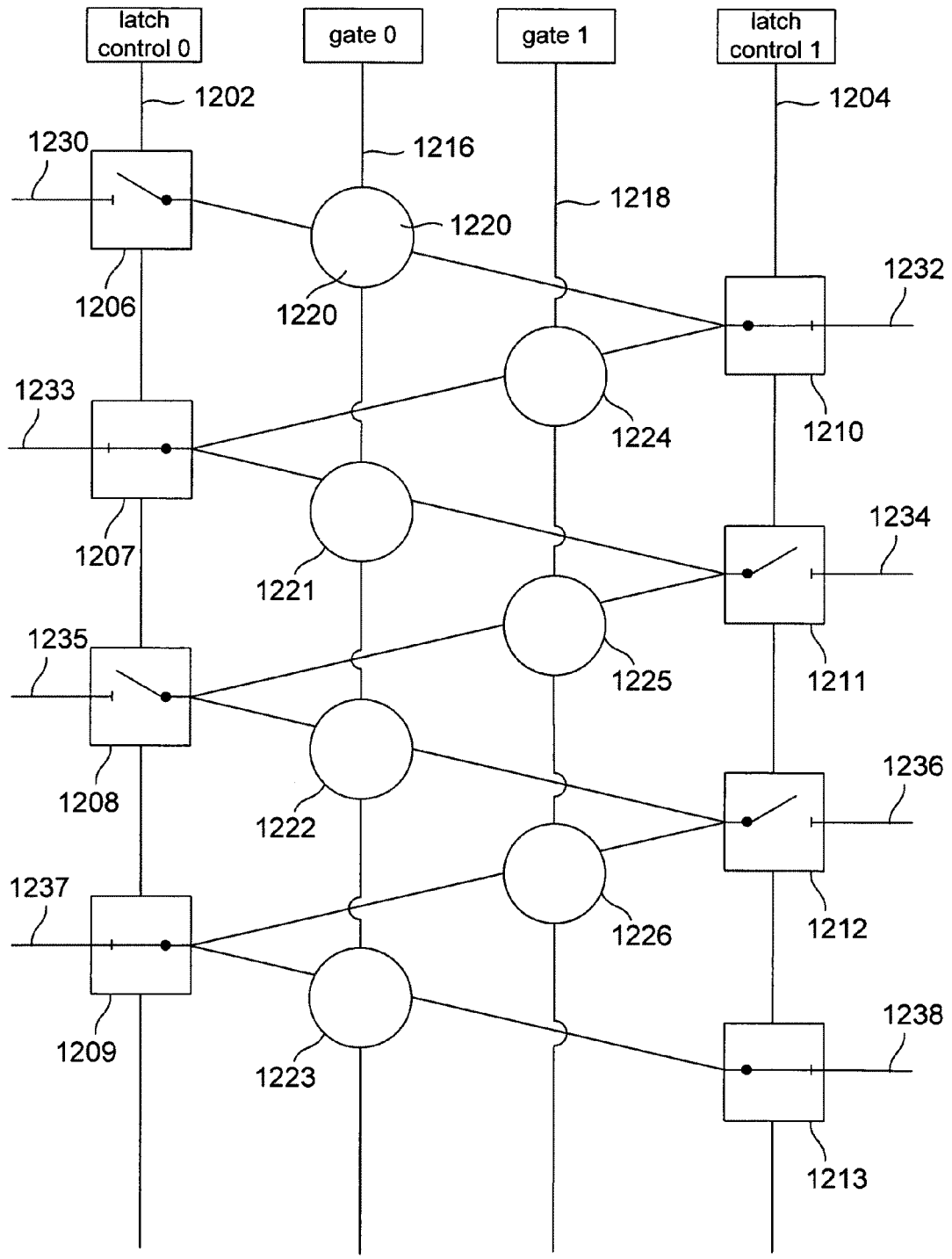
FIGS. 12A-12J illustrate operation of a described nanoscale shift-register embodiment of the present invention.

Initially, as shown in FIG. 12A, the states of the latches are either open or closed, in an essentially random pattern. Initially, all gates are in the OFF state, as indicated by the open circles, such as open circle 1220, representing the gates.

Figure 12B:
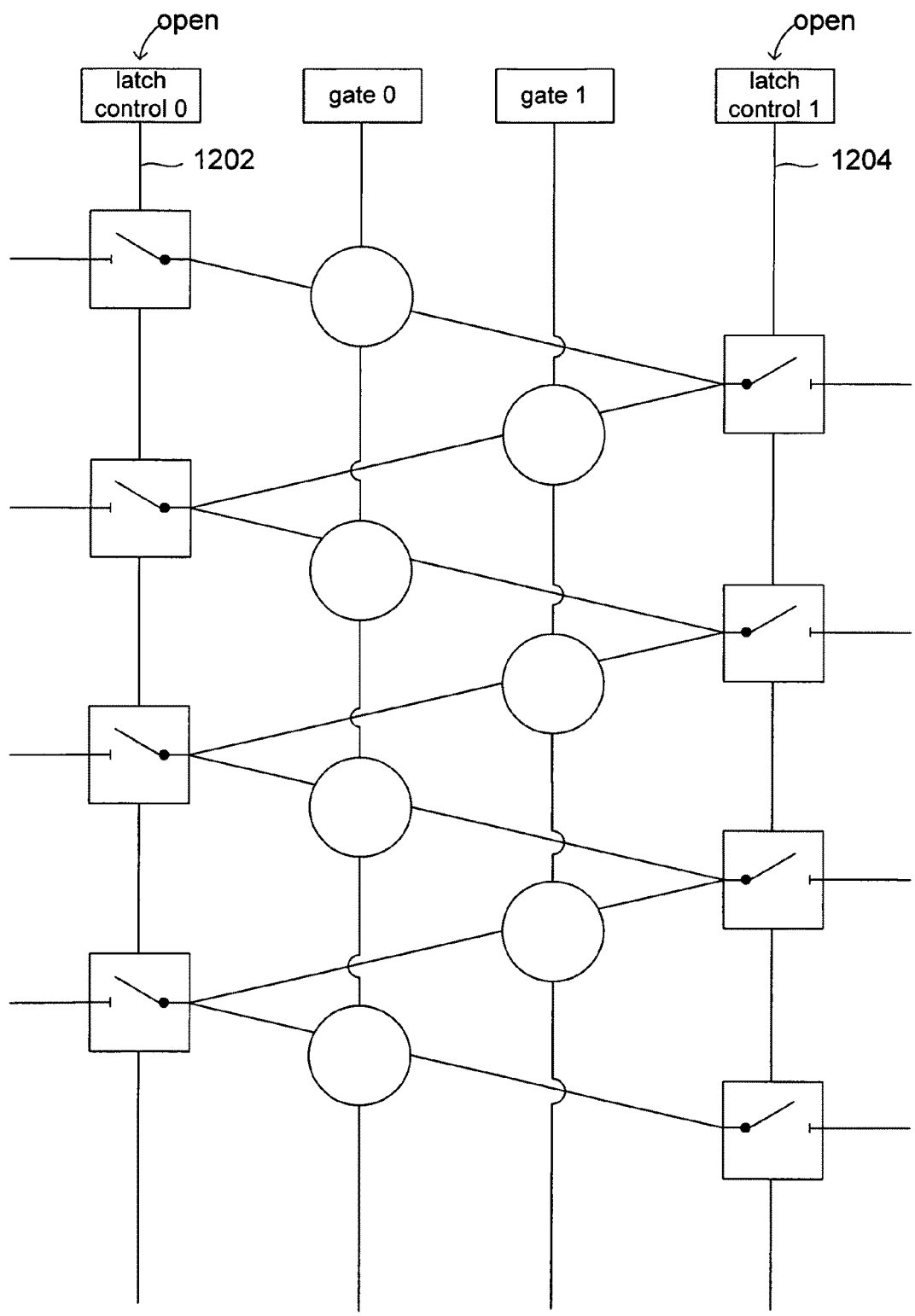
Figure 12C:
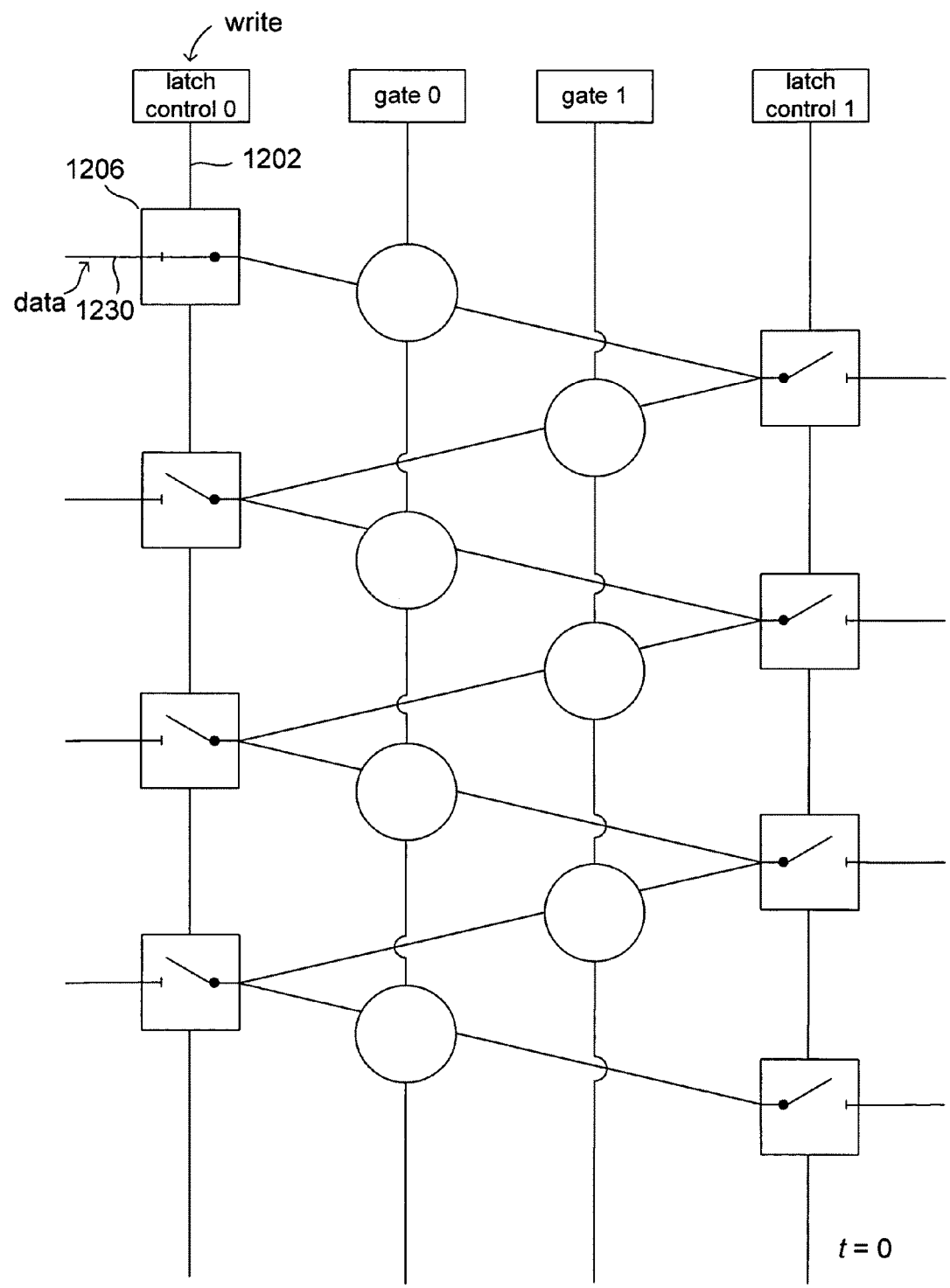
Figure 12D:
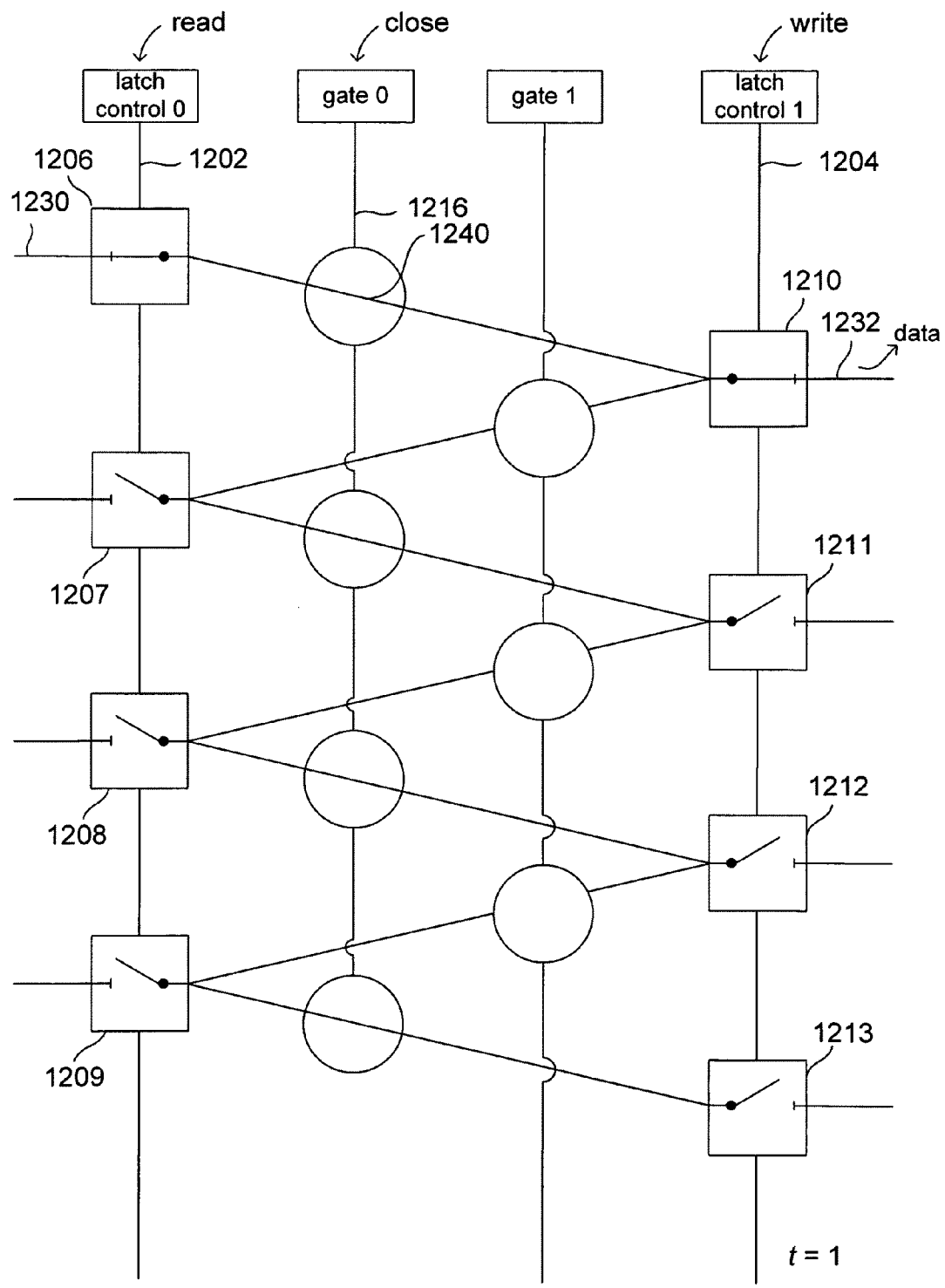
Figure 12E:
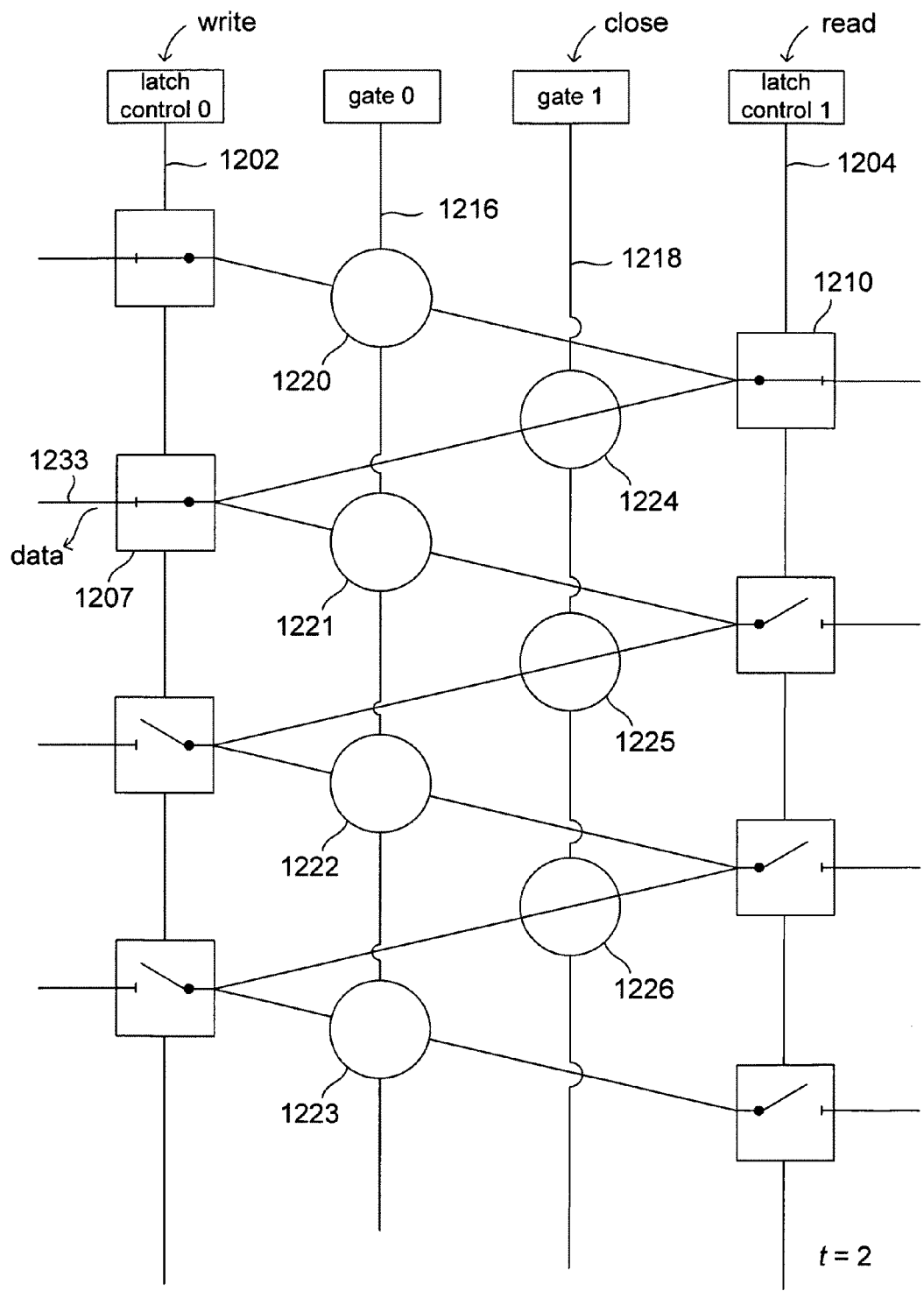
Figure 12F:
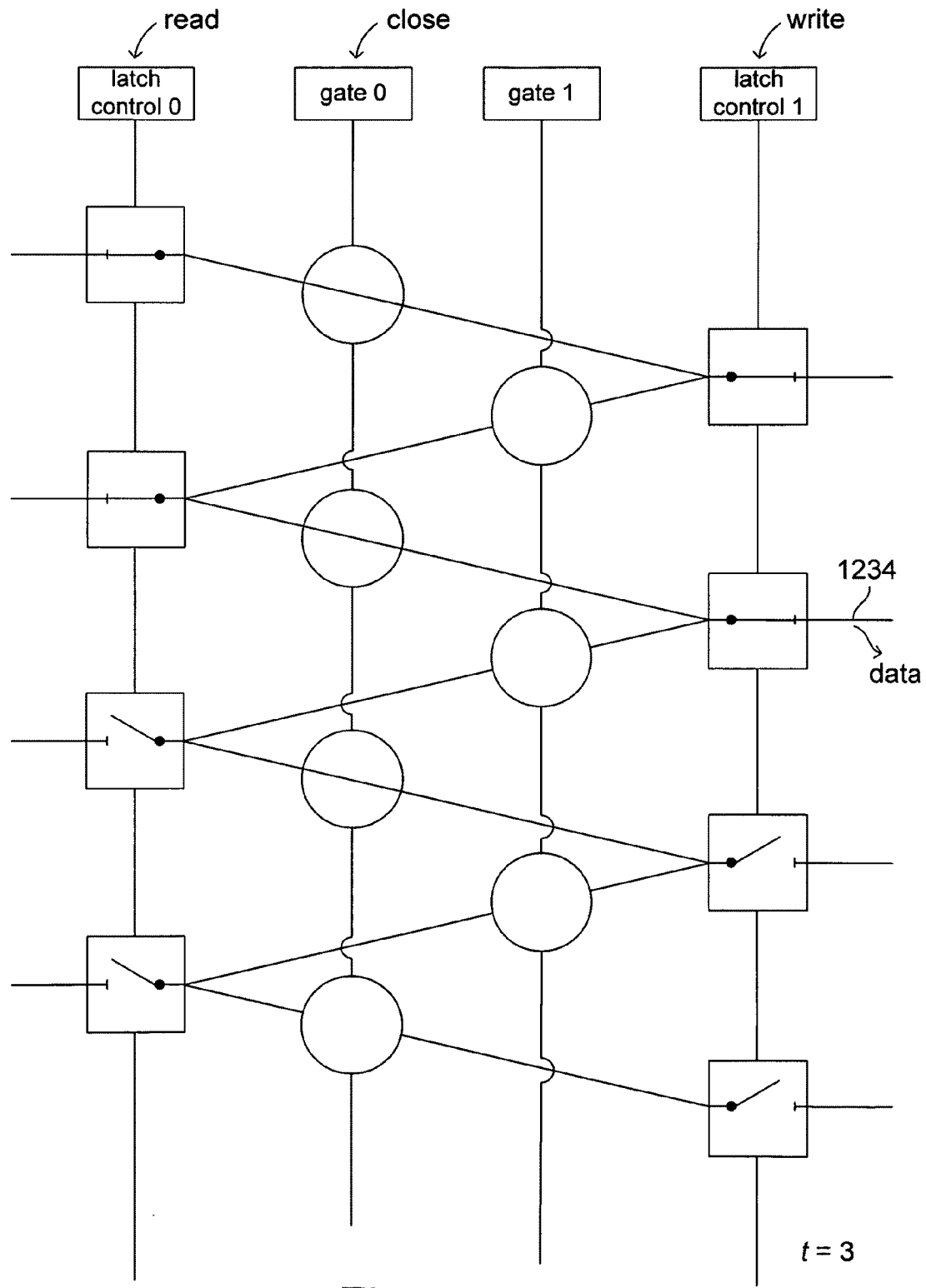
Figure 12G:
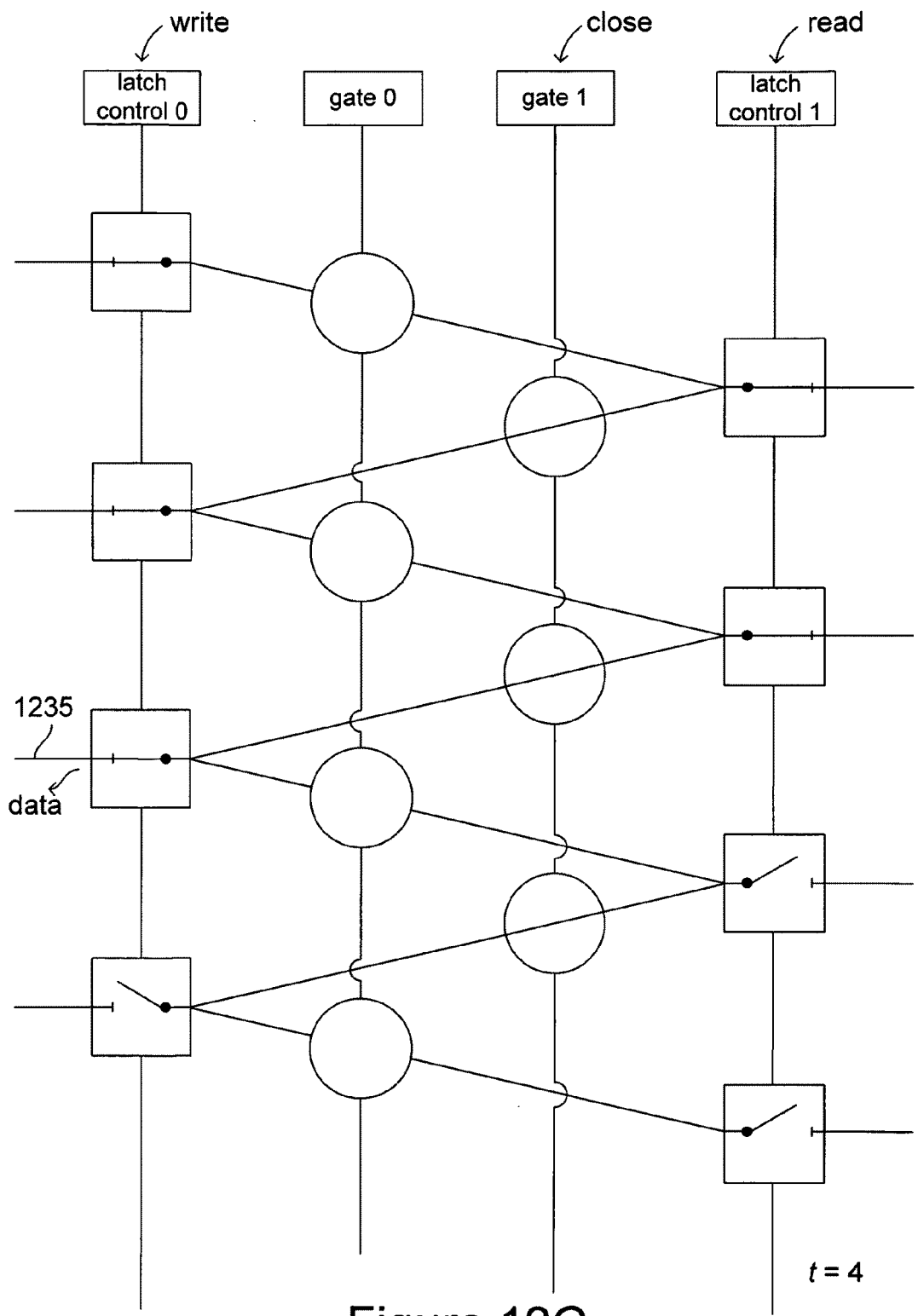
Figure 12H:
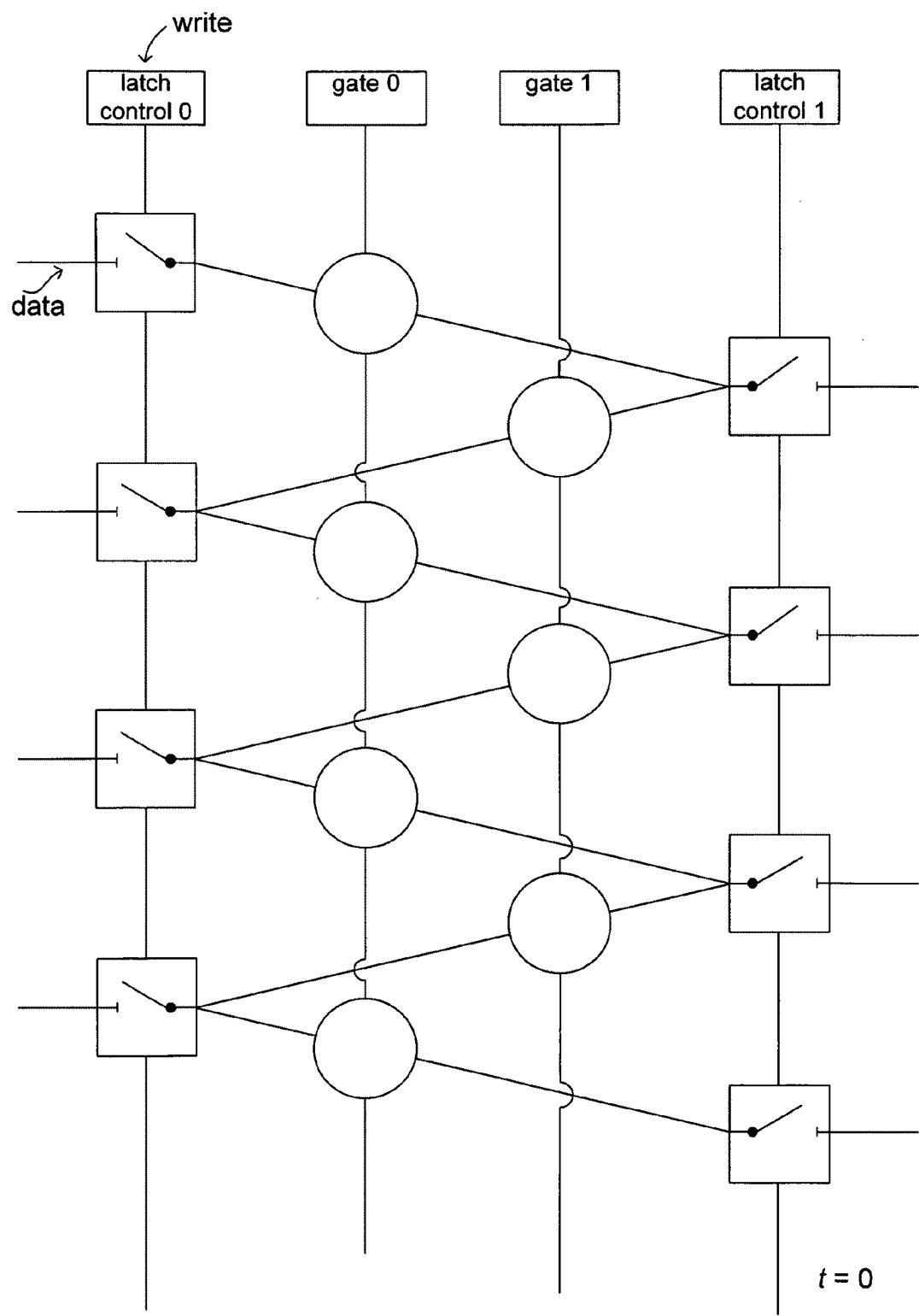
Figure 12I:
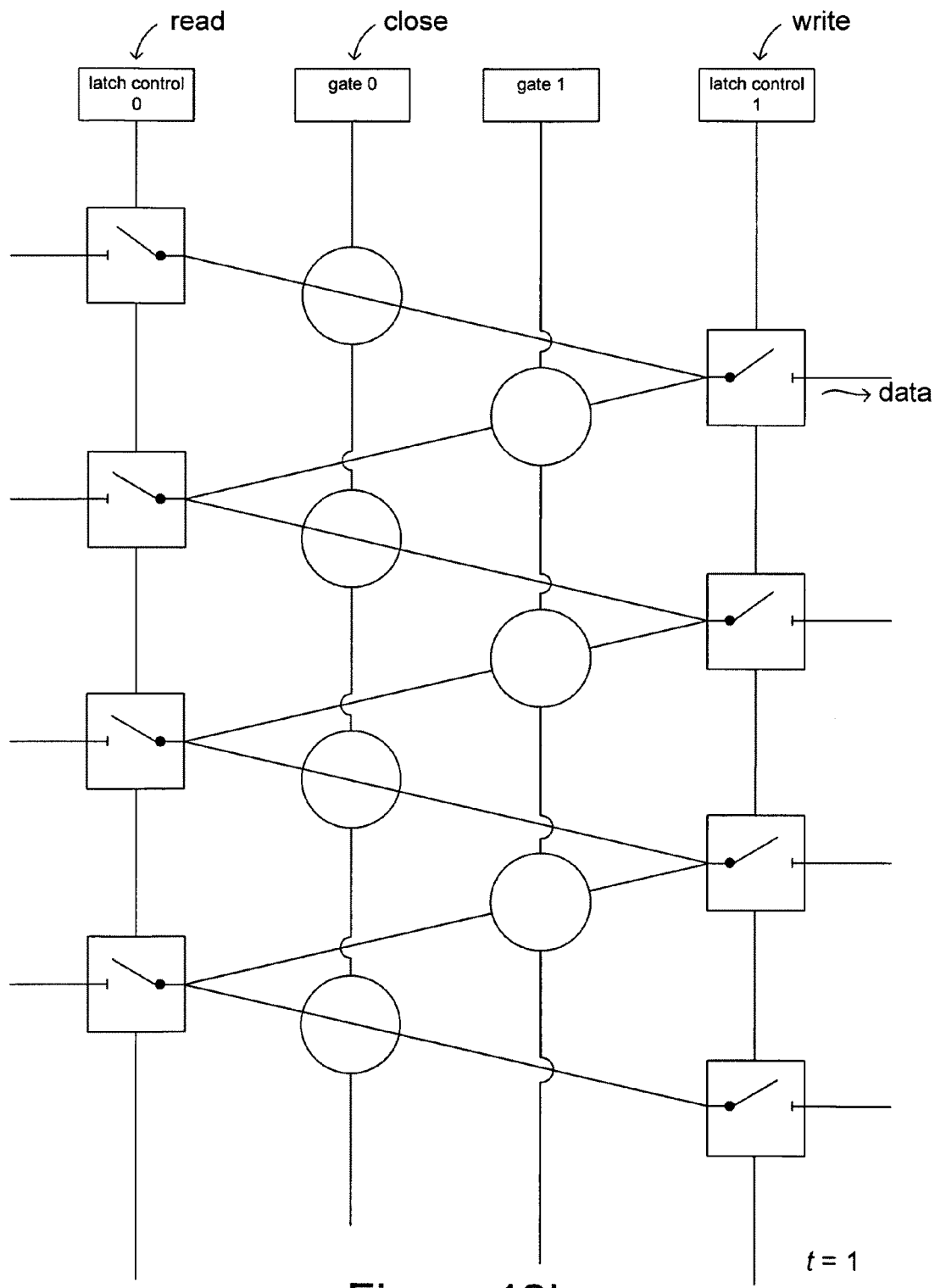
Figure 12J:
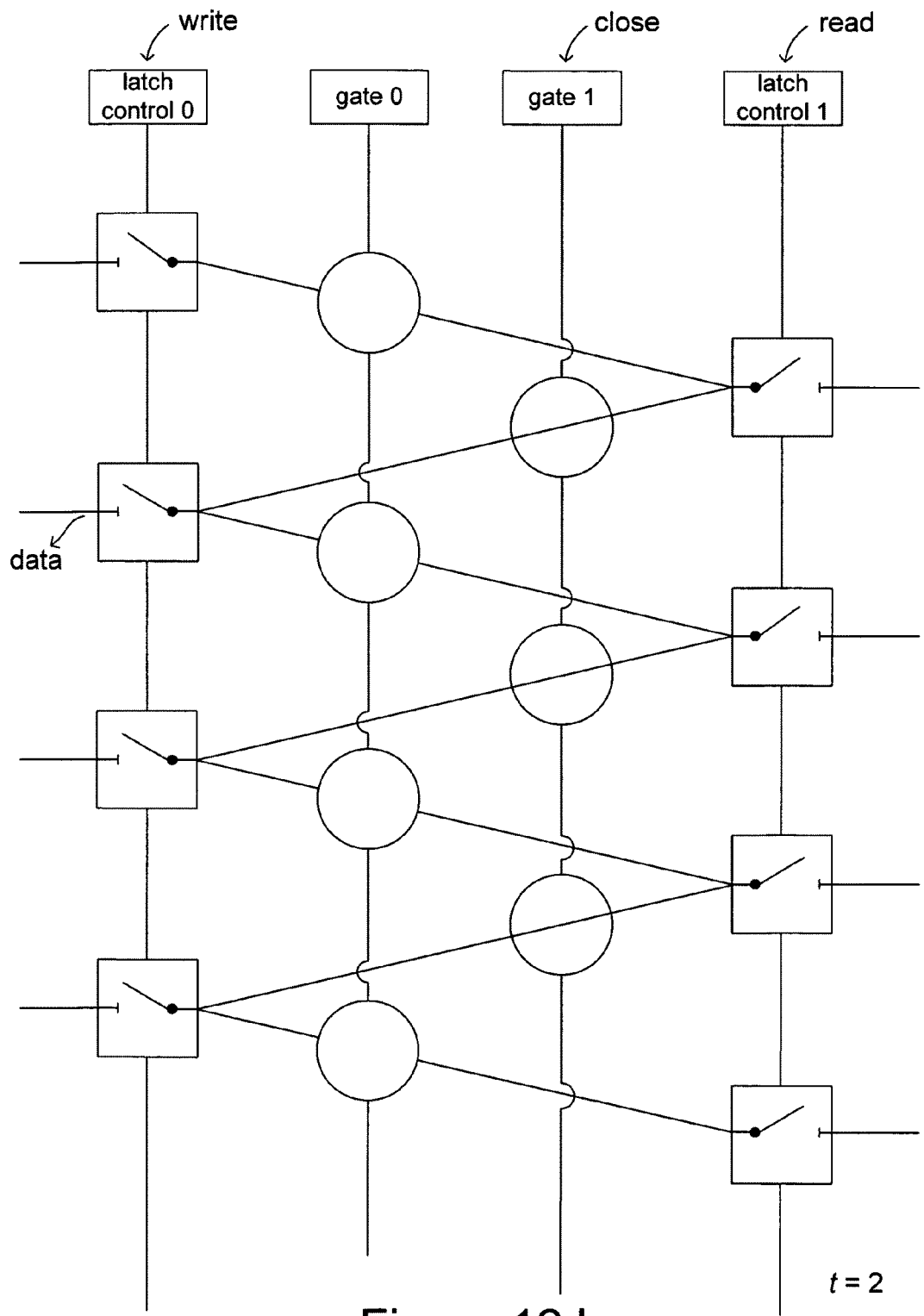

In a first step, shown in FIG. 12B, all the latches are opened by applying open signals to the two latch-control signal lines 1202 and 1204. Next, as shown in FIG. 12C, a single bit of data is input to latch 1206 on the input signal line 1230, with concurrent application of a WRITE signal to the first latch-control signal line 1202. In the first series of FIGS. 12C-12G, the input bit is assumed to be a "1" bit, and the open states of the non-inverting latches are considered to represent Boolean value "0." Thus, in FIG. 12C, input of the Boolean value "1" on the input signal line 1230 results in closing of latch 1206, to represent the Boolean value "1." Next, as shown in FIG. 12D, at a point in time referred to as "t=1," a signal is applied to the first gate signal line 1216 to place the gates controlled by the first gate signal line in an ON state, represented in FIG. 12D by interconnecting line segments, such as interconnecting line segment 1240, shown within the open circles representing gates. A READ signal is applied to the first latch-control line 1202 and a WRITE signal is applied to the second latch-control line 1204. This results in output of the contents of latch 1206 to latch 1210 and to signal line 1232. Since all of the remaining latches are similarly controlled, the contents of the latches 1207-1209 are also output, in this step, to latches 1211-1213. However, the demultiplexing operation carried out using the described nanoscale shift-register embodiment is a time-based demultiplexing, and so it is understood that at time t=1, the Boolean value initially input on input signal line 1230 is output to signal line 1232. Next, as shown in FIG. 12E, the signal applied to gate signal line 1216 is removed, and a signal is instead applied to gate signal line 1218. The first set of gates 1220-1223 are therefore placed in OFF states, and the second set of gates 1224-1226 are placed in ON states. A READ signal is applied to the second latch-control line 1204 and a WRITE signal is applied to the first latch-control line 12002. This results in transfer of the value stored in latch 1210 to latch 1207, with simultaneous output of the data value to signal line 1233. Output of the data value to signal line 1233 occurs at time t=2. This pattern of alternating opening and closing of gates, and transfer of data from one set of latches to the other set of latches continues, as shown in FIGS. 12F and 12G, to output the data value to signal line 1234 at time t=3, as shown in FIG. 12F, and to output the data value to signal line 1235 at time t=4. FIGS. 12H-12J show the first few steps of input and distribution of a data value "0" to the output signal lines similar to input and distribution of the data value "1" shown in FIGS. 12C-12E.

Many operational variations are possible. For example, transfer of an input data value from latch-to-latch and from nanowire-to-nanowire may be interrupted, prior to distribution of the data value to all latches and nanowires, at a point when it is known that the data value does not need to be distributed to any remaining latches and nanowires. In other words, the distribution operation may be truncated to distribute the data to only a first subset of the latches and nanowires. In alternative embodiments, rather than distributing an input data value to all of the nanowires, by sequential latch-to-latch operations prior to receiving a next data value for distribution, a next data value may be received while a previous data value is still being distributed, so that multiple, received data values are concurrently distributed to different nanowires. Thus, for example, a first-received data value may be distributed to the $4^{th}$ nanowire at the same time that a second-received data value is distributed to the $2^{nd}$ nanowire. In general, the nanoscale shift register of the present invention, when used as a demultiplexer, presents a time/space tradeoff, a time/manufacturing-cost tradeoff, and a time/reliability tradeoff. Nanoscale crossbar multiplexers have been developed for demultiplexing signals to a set of nanowires. However, the nanowire crossbars may take up a significant amount of space, and may be difficult and costly to manufacture, and may be less reliable than the smaller, more straightforwardly fabricated nanoscale shift register of the present invention. However, the mixed-scale crossbar demultiplexers can immediately distribute signals to all nanowires of a set of nanowires, while the nanoscale shift-register, operated as discussed above with respect to FIGS. 12A-12J, distributes a signal one nanowire at a time, over a period of time.

Although, when used to output arbitrary and generally patternless signals, use of the nanoscale shift register may represent a decided time/space tradeoff, there are cases in which nanoscale shift registers of the present invention may provide more efficient signal multiplexing than possible with traditional demultiplexers. For example, in the case that two nanoscale shift registers are used to input signals to a nanowire crossbar from two different directions, x and y, in order to change the state of nanowire-crossbar junctions, and in the case that the desired state of the nanowire junctions represents a regular pattern, such as a checkerboard of "1" and "0" values, or a block-diagonal matrix, or other such pattern, the nanoscale registers can be loaded, using READ voltages, with the x direction and y direction pattern specifications, and the pattern can then be generated, in one step, by applying WRITE voltages simultaneously to the two nanoscale shift registers.

Figure 13:
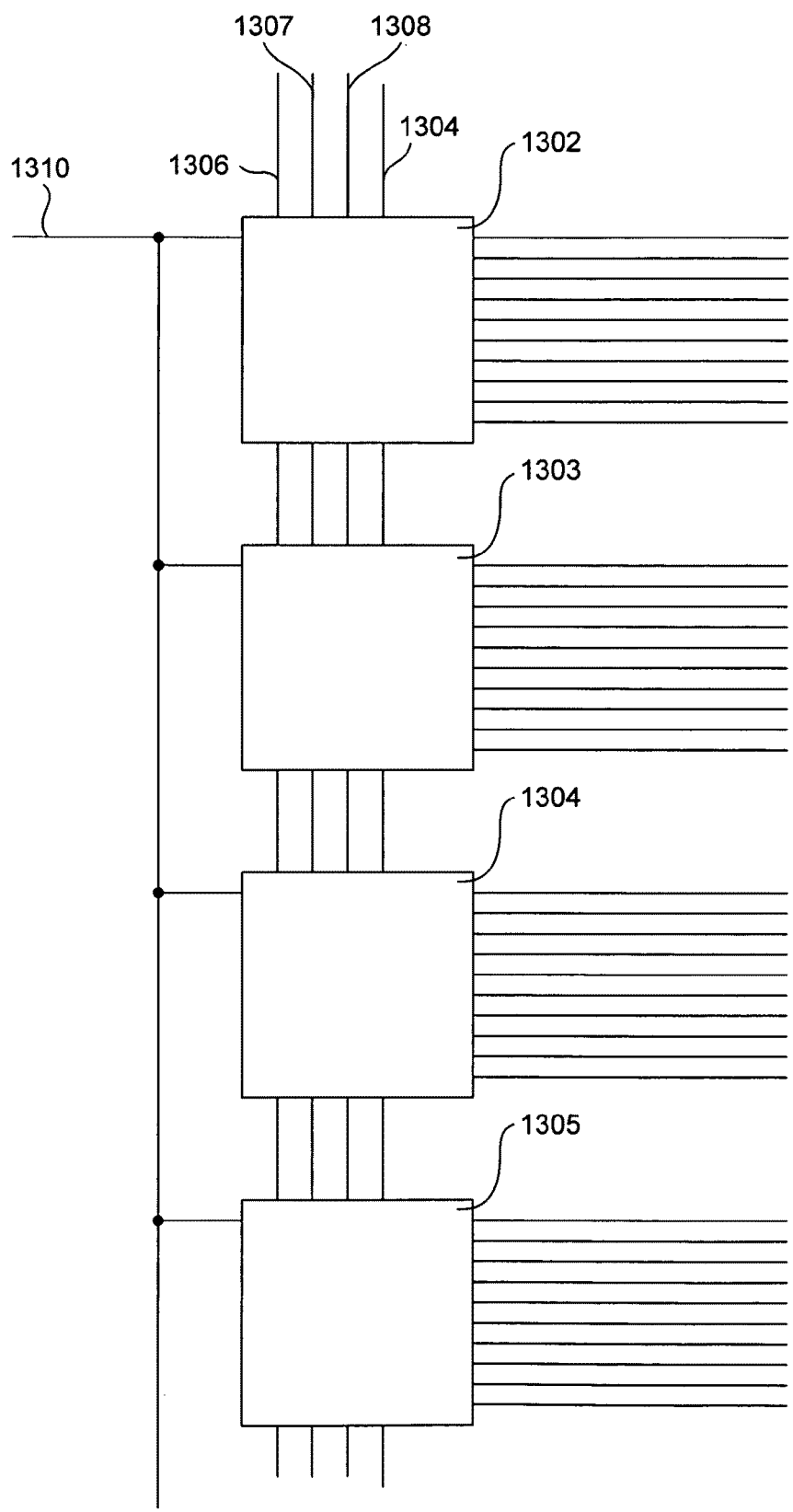
FIG. 13 illustrates a multi-nanoscale shift-register demultiplexing circuit that represents one embodiment of the present invention.

The nanoscale shift register of the present invention may be incorporated into more complex shift registers in order to distribute signals for a large set of nanowires more efficiently in time. FIG. 13 illustrates one such demultiplexing circuit. In FIG. 13, four nanoscale demultiplexers 1302-1305 are linked together by commonly shared latch-control and gate signal lines 1306-1309. The input data line 1310 is divided in input to each of the four nanoscale shift registers. Thus, at a given point in time, an input data value may be distributed to four different nanowires by the four nanoscale shift registers, rather than to only one nanowire when a single nanoscale shift register is employed. Thus, by employing n nanoscale shift registers, the total time to distribute a data value to m signal lines can, in general, be decreased from m to m divided n.

Although the present invention has been described in terms of a particular embodiment, it is not intended that the invention be limited to this embodiment. Modifications within the spirit of the invention will be apparent to those skilled in the art. For example, as discussed above, many different types of latches may be used in various embodiments of the nanoscale shift registers that represent embodiments of the present invention. Different open, READ, and WRITE signals may need to be applied to the latch-control signal lines in order to initialize the nanoscale shift register and transfer data from one latch to another, depending on the types of latches employed in the nanoscale shift register. A variety of different types of FET gates may also be employed. The nanoscale of the present invention can be fabricated to distribute data values to an arbitrary number of nanowire signal lines, and may be combined into more complex nanoscale and mixed-scale logic circuits and devices to carry out shift-register functions as needed by those circuits and devices. Either or both of the latch-control lines and the gate signal lines may be fabricated as nanowires, rather than as microscale lines, resulting in a purely nanoscale shift register. The above-described mixed-scale shift register is or particular use in interfacing microscale and sub-microscale electronics and circuits to nanoscale electronics and circuits, but both mixed-scale and purely nanoscale shift registers may find a variety of uses and application The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method for inputting a data-value pattern into a nanowire crossbar, the method comprising:
    providing a first nanoscale shift register with output signal lines that form or interconnect with a first parallel set of nanowire-crossbar nanowires;
    providing a second nanoscale shift register with output signal lines that form or interconnect with a second parallel set of nanowire-crossbar nanowires;
    storing a first pattern of values in the first nanoscale shift register and a second pattern of values in the second nanoscale shift register using voltage signals below the WRITE voltage for junctions of the nanowire crossbar; and
    applying voltage signals greater than or equal to the WRITE threshold for junctions of the nanowire crossbar to write the pattern of data values into the nanowire crossbar.

2. The method of claim 1 wherein each nanoscale shift register comprises:
    a first set of nanowires interconnected through a first set of latches to a first latch-control signal line; and
    a second set of nanowires interconnected through a second set of latches to a second latch-control signal line, the nanowires of the first set of nanowires and the nanowires of the second set of nanowires arranged in a sequence that includes a first nanowire, a last nanowire, and a subsequence of internal nanowires between the first nanowire and the last nanowire, each internal nanowire of the second set of nanowires interconnected through a gate of a first set of gates controlled by a first gate signal line to a preceding nanowire of the first set of nanowires and interconnected through a gate of a second set of gates controlled by a second gate signal line to a next nanowire of the first set of nanowires.

3. The method of claim 2 wherein inputting the received data value into the first latch of a said nanoscale shift register further comprises:
    inputting one or more signals on the latch-control signal lines to place all of the latches into a first state representing one of two Boolean values; and
    inputting the received data value to a first nanowire interconnected with a first latch of the first set of latches and inputting one or more control signals to the first latch-control signal line to store the received data value in the first latch.

4. The method of claim 3 wherein inputting signals to latch-control signal lines and gate signal lines of the nanoscale shift register to successively output the received data value to each of the nanowires of the set of nanowires further comprises:
    alternatively
        inputting a signal to the first gate signal line to electrically interconnect pairs of nanowires, each pair or nanowires comprising a nanowire of the first set of nanowires reversibly connected to the succeeding nanowire of the second set of nanowires by a gate controlled the first gate signal lines and inputting one or more control signals to the latch-control signal lines to transfer data through the interconnected pairs of nanowires from the first set of latches to the second set of latches; and
        inputting a signal to the second gate signal line to electrically interconnect pairs of nanowires, each pair or nanowires comprising a nanowire of the second set of nanowires reversibly connected to the succeeding nanowire of the first set of nanowires by a gate controlled the second gate signal line and inputting one or more control signals to the latch-control signal lines to transfer data through the interconnected pairs of nanowires from the second set of latches to the first set of latches.

5. Computer instructions stored in a computer-readable medium that implement a method for inputting a data-value pattern into a nanowire crossbar, the method comprising:
    storing a first pattern of values in a first nanoscale shift register and a second pattern of values in a second nanoscale shift register using voltage signals below the WRITE voltage for junctions of the nanowire crossbar; and
    applying voltage signals greater than or equal to the WRITE threshold for junctions of the nanowire crossbar to write the pattern of data values into the nanowire crossbar.

6. The method of claim 5 wherein each nanoscale shift register comprises:
    a first set of nanowires interconnected through a first set of latches to a first latch-control signal line; and
    a second set of nanowires interconnected through a second set of latches to a second latch-control signal line, the nanowires of the first set of nanowires and the nanowires of the second set of nanowires arranged in a sequence that includes a first nanowire, a last nanowire, and a subsequence of internal nanowires between the first nanowire and the last nanowire, each internal nanowire of the second set of nanowires interconnected through a gate of a first set of gates controlled by a first gate signal line to a preceding nanowire of the first set of nanowires and interconnected through a gate of a second set of gates controlled by a second gate signal line to a next nanowire of the first set of nanowires.

7. The method of claim 6 wherein inputting the received data value into the first latch of a said nanoscale shift register further comprises:
    inputting one or more signals on the latch-control signal lines to place all of the latches into a first state representing one of two Boolean values; and
    inputting the received data value to a first nanowire interconnected with a first latch of the first set of latches and inputting one or more control signals to the first latch-control signal line to store the received data value in the first latch.

8. The method of claim 7 wherein inputting signals to latch-control signal lines and gate signal lines of a said nanoscale shift register to successively output the received data value to each of the nanowires of the set of nanowires further comprises:
    alternatively
        inputting a signal to the first gate signal line to electrically interconnect pairs of nanowires, each pair or nanowires comprising a nanowire of the first set of nanowires reversibly connected to the succeeding nanowire of the second set of nanowires by a gate controlled the first gate signal lines and inputting one or more control signals to the latch-control signal lines to transfer data through the interconnected pairs of nanowires from the first set of latches to the second set of latches; and inputting a signal to the second gate signal line to electrically interconnect pairs of nanowires, each pair or nanowires comprising a nanowire of the second set of nanowires reversibly connected to the succeeding nanowire of the first set of nanowires by a gate controlled the second gate signal line and inputting one or more control signals to the latch-control signal lines to transfer data through the interconnected pairs of nanowires from the second set of latches to the first set of latches.

9. Control logic implemented in logic circuits that implements a method for distributing a received data value to each of a set of nanowires comprising:

storing a first pattern of values in a first nanoscale shift register and a second pattern of values in a second nanoscale shift register using voltage signals below the WRITE voltage for junctions of the nanowire crossbar; and applying voltage signals greater than or equal to the WRITE threshold for junctions of the nanowire crossbar to write the pattern of data values into the nanowire crossbar.

10. The method of claim 9 wherein each nanoscale shift register comprises:

a first set of nanowires interconnected through a first set of latches to a first latch-control signal line; and a second set of nanowires interconnected through a second set of latches to a second latch-control signal line, the nanowires of the first set of nanowires and the nanowires of the second set of nanowires arranged in a sequence that includes a first nanowire, a last nanowire, and a subsequence of internal nanowires between the first nanowire and the last nanowire, each internal nanowire of the second set of nanowires interconnected through a gate of a first set of gates controlled by a first gate signal line to a preceding nanowire of the first set of nanowires and interconnected through a gate of a second set of gates controlled by a second gate signal line to a next nanowire of the first set of nanowires.

11. The method of claim 10 wherein inputting the received data value into the first latch of a said nanoscale shift register further comprises:

inputting one or more signals on the latch-control signal lines to place all of the latches into a first state representing one of two Boolean values; and inputting the received data value to a first nanowire interconnected with a first latch of the first set of latches and inputting one or more control signals to the first latch-control signal line to store the received data value in the first latch.

12. The method of claim 11 wherein inputting signals to latch-control signal lines and gate signal lines of a said nanoscale shift register to successively output the received data value to each of the nanowires of the set of nanowires further comprises:

alternatively inputting a signal to the first gate signal line to electrically interconnect pairs of nanowires, each pair or nanowires comprising a nanowire of the first set of nanowires reversibly connected to the succeeding nanowire of the second set of nanowires by a gate controlled the first gate signal lines and inputting one or more control signals to the latch-control signal lines to transfer data through the interconnected pairs of nanowires from the first set of latches to the second set of latches; and inputting a signal to the second gate signal line to electrically interconnect pairs of nanowires, each pair or nanowires comprising a nanowire of the second set of nanowires reversibly connected to the succeeding nanowire of the first set of nanowires by a gate controlled the second gate signal line and inputting one or more control signals to the latch-control signal lines to transfer data through the interconnected pairs of nanowires from the second set of latches to the first set of latches.

* * * * *

UNITED STATES PATENT AND TRADEMARK OFFICE
CERTIFICATE OF CORRECTION

PATENT NO. : 7,652,911 B2  Page 1 of 1
APPLICATION NO. : 12/331642
DATED : January 26, 2010
INVENTOR(S) : Gregory S. Snider et al.

It is certified that error appears in the above-identified patent and that said Letters Patent is hereby corrected as shown below:

In column 15, line 25, in Claim 1, delete "crossbar," and insert -- crossbar; --, therefor.

Signed and Sealed this

Twenty-seventh Day of July, 2010

David J. Kappos
*Director of the United States Patent and Trademark Office*